(12) United States Patent
Park et al.

(10) Patent No.: US 11,935,903 B2
(45) Date of Patent: Mar. 19, 2024

(54) DISPLAY APPARATUS

(71) Applicant: Samsung Display Co., Ltd., Yongin-Si (KR)

(72) Inventors: Hyungjun Park, Yongin-si (KR); Jaewon Kim, Yongin-si (KR); Seungwoo Sung, Yongin-si (KR); Junyong An, Yongin-si (KR); Youngsoo Yoon, Yongin-si (KR); Ilgoo Youn, Yongin-si (KR); Jieun Lee, Yongin-si (KR); Yunkyeong In, Yongin-si (KR); Donghyeon Jang, Yongin-si (KR); Junyoung Jo, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 56 days.

(21) Appl. No.: 17/832,445

(22) Filed: Jun. 3, 2022

(65) Prior Publication Data

US 2022/0302179 A1 Sep. 22, 2022

Related U.S. Application Data

(63) Continuation of application No. 16/535,030, filed on Aug. 7, 2019, now Pat. No. 11,355,526.

(30) Foreign Application Priority Data

Nov. 30, 2018 (KR) .................. 10-2018-0153020

(51) Int. Cl.
  *G09F 9/30* (2006.01)
  *H01L 27/12* (2006.01)
  (Continued)

(52) U.S. Cl.
  CPC .......... *H01L 27/1244* (2013.01); *G09F 9/301* (2013.01); *H10K 59/124* (2023.02); *H10K 59/131* (2023.02); *G09G 2380/02* (2013.01)

(58) Field of Classification Search
  None
  See application file for complete search history.

(56) References Cited

U.S. PATENT DOCUMENTS

| 7,855,505 | B2 | 12/2010 | Jung et al. |
| 8,558,239 | B2 | 10/2013 | Lee et al. |

(Continued)

FOREIGN PATENT DOCUMENTS

| KR | 10-1117725 B1 | 3/2012 |
| KR | 10-2017-0115153 A | 10/2017 |
| KR | 10-2017-0115164 A | 10/2017 |

OTHER PUBLICATIONS

European Search report and written opinion for EP 19212699, filed Feb. 27, 2020 (Year: 2020).*

*Primary Examiner* — Telly D Green
(74) *Attorney, Agent, or Firm* — Innovation Counsel LLP

(57) ABSTRACT

A display apparatus includes a substrate, a display unit, a wire structure, and a first power supply structure. The substrate includes a display area, a first non-display area neighboring the display area, a second non-display area, and a bending area between the first non-display area and the second non-display area. The display unit is on the display area. The wire structure is on the first non-display area, the bending area, and the second non-display area and includes a first wire set and a second wire set overlapping the bending area and spaced from each other. The first power supply structure includes a first conductive line and a second conductive line on the first non-display area and the second non-display area, respectively, and includes a connection line connecting the first conductive line to the second (Continued)

conductive line and positioned between the first wire set and the second wire set. optimized.

20 Claims, 18 Drawing Sheets

(51) Int. Cl.
*H10K 59/124* (2023.01)
*H10K 59/131* (2023.01)

(56) References Cited

U.S. PATENT DOCUMENTS

| | | | |
|---|---|---|---|
| 9,646,525 | B2 | 5/2017 | Kim et al. |
| 9,893,093 | B2 | 2/2018 | Kim et al. |
| 9,893,139 | B2 | 2/2018 | Kim et al. |
| 10,304,862 | B2 | 5/2019 | Ka et al. |
| 10,636,711 | B2 | 4/2020 | Kim et al. |
| 10,691,238 | B2 | 6/2020 | Cai et al. |
| 2015/0161928 | A1 | 6/2015 | Kim et al. |
| 2017/0287936 | A1 | 10/2017 | Kim et al. |
| 2017/0287937 | A1 | 10/2017 | Ka et al. |
| 2017/0288008 | A1 | 10/2017 | Kim et al. |
| 2017/0359909 | A1 | 12/2017 | Lee et al. |
| 2018/0067599 | A1 | 3/2018 | Cai et al. |
| 2018/0286938 | A1 | 10/2018 | Moon et al. |
| 2018/0350701 | A1 | 12/2018 | Kim et al. |
| 2020/0175917 | A1 | 6/2020 | Jo et al. |

\* cited by examiner

DISPLAY APPARATUS

CROSS-REFERENCE TO RELATED APPLICATIONS

This application is a continuation application of U.S. patent application Ser. No. 16/535,030 filed on Aug. 7, 2019, which claims priority to Korean Patent Application No. 10-2018-0153020 filed on Nov. 30, 2018 in the Korean Intellectual Property Office; the related applications are incorporated by reference.

BACKGROUND

1. Field

The technical field relates to a display apparatus.

2. Description of the Related Art

A display apparatus, such as an organic light-emitting display apparatus, may include a display portion for displaying images and may include a wiring portion having wires for connecting to an external device. The wiring portion may be part of a non-display area. The non-display area may not display images according to input signals but may undesirably add to the size of the display apparatus.

SUMMARY

One or more embodiments may be related to a display apparatus having a minimized unutilized space and having satisfactory luminous uniformity.

According to one or more embodiments, a display apparatus includes: a substrate including a display area, a first non-display area adjacent to the display area, a second non-display area, and a bending area between the first non-display area and the second non-display area; a display unit positioned in the display area; a fan-out portion positioned in the first non-display area, the bending area, and the second non-display area and including a first fan-out portion and a second fan-out portion positioned in the bending area with a first separation area between the first fan-out portion and the second fan-out portion; and a first power supply portion including first conductive lines and second conductive lines positioned in the first non-display area and the second non-display area, respectively, along a first direction, and a first connection line that connects the first conductive lines to the second conductive lines along a second direction that intersects with the first direction, at least a part of the first connection line being positioned in the first separation area.

At least a part of the first connection line may be positioned in the bending area.

At least a part of the first power supply portion may overlap the fan-out portion.

The first power supply portion may overlap the fan-out portion in the first non-display area and the second non-display area.

The first power supply portion may supply an electrode power to the display unit.

The display apparatus may further include a second power supply portion positioned in the non-display area at an outer edge of the first power supply portion.

The display unit may include a light-emitting device including a pixel electrode, a common electrode positioned on the pixel electrode, and an intermediate layer between the pixel electrode and the common electrode and including an emission layer, and the second power supply portion may be electrically connected to the common electrode.

At least a part of the second power supply portion may overlap the fan-out portion.

The second power supply portion may supply a common power to the display unit.

The fan-out portion may further include a third fan-out portion positioned with a second separation area between the second fan-out portion and the third fan-out portion.

The first power supply portion may further include a second connection line positioned in the second separation area.

At least a part of the second connection line may be positioned in the bending area.

At least a part of the second power supply portion may be positioned in the second separation area.

The second power supply portion may include third conductive lines and fourth conductive lines positioned in the first non-display area and the second non-display area, respectively, along the first direction, and a third connection line that connects the third conductive lines to the fourth conductive lines along the second direction, at least a part of the third connection line being positioned in the second separation area.

At least a part of the third connection line may be positioned in the bending area.

The fan-out portion may further include a third fan-out portion positioned with the second separation area between the second fan-out portion and the third fan-out portion, and a fourth fan-out portion positioned with a third separation area between the third fan-out portion and the fourth fan-out portion.

The first power supply portion may further include a second connection line positioned in the second separation area, and the second power supply portion may include third conductive lines and fourth conductive lines positioned in the first non-display area and the second non-display area, respectively, along the first direction and a third connection line that connects the third conductive lines to the fourth conductive lines along the second direction, at least a part of the third connection line being positioned in the third separation area.

At least a part of the third connection line may be positioned in the bending area.

The first connection line may not overlap the fan-out portion in the bending area.

The fan-out portion and the first power supply portion may be symmetrically positioned based on a symmetry axis.

The bending area may be bent based on a bending axis in parallel to the first direction.

The fan-out portion may include a plurality of wirings, and each of the plurality of wirings may include a first conductive layer positioned in the first non-display area, a second conductive layer positioned in the second non-display area, and a connection layer positioned in the bending area and connecting the first conductive layer to the second conductive layer.

The display portion may include a thin-film transistor and a light-emitting device connected to the thin-film transistor, and the thin-film transistor may include a semiconductor layer, a gate electrode, at least a part of the gate electrode overlapping the semiconductor layer, and an electrode layer electrically connected to the semiconductor layer, and the first conductive layer and the second conductive layer may include the same material as the gate electrode, and the connection layer may include the same material as the electrode layer.

The first power supply portion may include the same material as the electrode layer.

According to one or more embodiments, a display apparatus includes: a substrate including a display area, a first non-display area adjacent to the display area, a second non-display area, and a bending area between the first non-display area and the second non-display area; a fan-out portion positioned in the first non-display area, the bending area, and the second non-display area and including a plurality of conductive lines apart from one another by a predetermined distance; and a first power supply portion positioned in the first non-display area, the bending area, and the second non-display area, at least a part of the first power supply portion being positioned between the plurality of conductive lines.

The bending area may be bent based on a bending axis that extends along a first direction, and the plurality of conductive lines and the first power supply portion may be positioned in the bending area in a second direction that intersects with the first direction.

The plurality of conductive lines and the first power supply portion may not overlap each other in the bending area.

An embodiment may be related to a display apparatus. The display apparatus may include a substrate, a display unit, a wire structure, and a first power supply structure. The substrate may include a display area, a first non-display area adjacent to the display area, a second non-display area, and a bending area connected between the first non-display area and the second non-display area. The display unit may be positioned on the display area. The wire structure may be positioned on the first non-display area, the bending area, and the second non-display area and may include a first wire set and a second wire set overlapping the bending area and spaced from each other. The first power supply structure may include a first conductive line and a second conductive line positioned on the first non-display area and the second non-display area, respectively, and may include a first connection line that connects the first conductive line to the second conductive line and is positioned between the first wire set and the second wire set.

The first connection line may overlap the bending area.

The first conductive line may overlap the wire structure.

The second conductive line may overlap the wire structure.

The first power supply structure may be electrically connected to an electrode of the display unit.

The display apparatus may include a second power supply structure positioned between the first conductive line and the second conductive line, spaced from the first connection line, and overlapping each of the first non-display area, the bending area, and the second non-display area.

The display unit may include a pixel electrode, a common electrode overlapping the pixel electrode, and an emission layer between the pixel electrode and the common electrode. The second power supply structure may be electrically connected to the common electrode.

At least a part of the second power supply structure may overlap the wire structure.

The second power supply structure may be electrically connected to a common electrode of the display unit.

The wire structure may include a third wire set spaced from the second wire set.

The first power supply structure may include a second connection line directly connected to each of the first conductive lien and the second conductive line and positioned between the second wire set and the third wire set.

The second connection line may overlap the bending area.

At least a part of the second power supply structure may be positioned between the second wire set and the third wire set.

The second power supply structure may include a third conductive line and a fourth conductive line positioned on the first non-display area and the second non-display area, respectively, and may include a third connection line that connects the third conductive line to the fourth conductive line. The third connection line may be positioned between the second wire set and the third wire set.

The third connection line may overlap the bending area.

The wire structure may include a third wire set spaced from the second wire set and may include a fourth wire set spaced from the third wire set.

The first power supply structure may include a second connection line positioned between the second wire set and the third wire set. The second power supply structure may include a third conductive line and a fourth conductive line positioned on the first non-display area and the second non-display area, respectively, and may include a third connection line that connects the third conductive line to the fourth conductive line and is positioned between the third wire set and the fourth wire set or between the second wire set and the third wire set.

The third connection line may overlap the bending area.

A section of the first connection line may overlap the bending area and may not overlap the wire structure.

Each of the wire structure and the first power supply structure may be symmetrical.

The bending area may be bent based on a bending axis parallel to a lengthwise direction of the first conductive line.

The first wire set may include a first wire. The first wire may include a first conductive layer positioned on the first non-display area, a second conductive layer positioned on the second non-display area, and a connection layer positioned on the bending area and connecting the first conductive layer to the second conductive layer.

The display unit may include a thin-film transistor and a light-emitting device connected to the thin-film transistor. The thin-film transistor may include a semiconductor layer, a gate electrode overlapping the semiconductor layer, and an electrode layer electrically connected to the semiconductor layer. The first conductive layer and the second conductive layer may include a same material as the gate electrode. The connection layer may include a same material as the electrode layer.

The first power supply structure may include a same material as the electrode layer.

An embodiment may be related to a display apparatus. The display apparatus may include the following elements: a substrate including a display area, a first non-display area adjacent to the display area, a second non-display area, and a bending area connected between the first non-display area and the second non-display area; a wire structure positioned on the first non-display area, the bending area, and the second non-display area and including conductive lines spaced from one another; and a first power supply structure positioned on the first non-display area, the bending area, and the second non-display area, at least a part of the first power supply portion being positioned between the conductive lines.

The bending area may be bent based on a bending axis that extends in a first direction. The conductive lines and the part of the first power supply structure may be spaced from each other in the first direction.

Sections of the conductive lines may overlap the bending area and may not overlap the first power supply structure.

DETAILED DESCRIPTION

Figure 1:
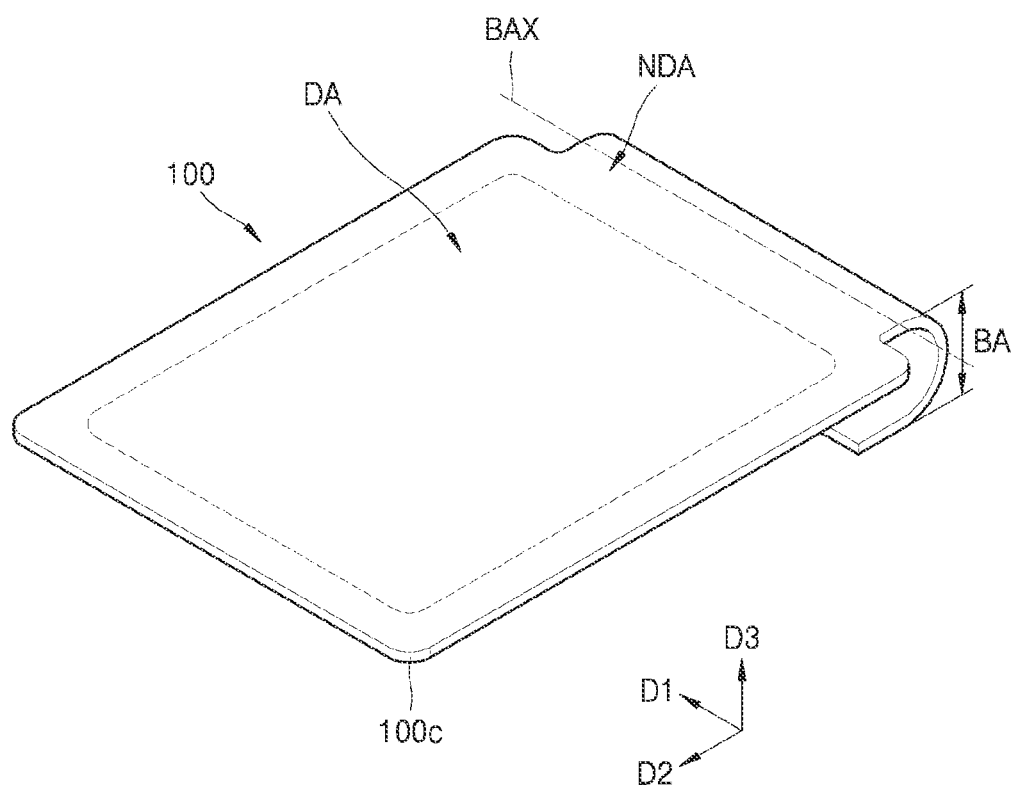
FIG. 1 is a perspective view schematically illustrating a part of a display apparatus according to an embodiment.

Example embodiments are described with reference to the accompanying drawings. Like reference numerals may refer to like elements.

Although the terms "first," "second," etc. may be used to describe various elements, these elements should not be limited by these terms. These terms may be used to distinguish one component from another. A first element may be termed a second element without departing from teachings of one or more embodiments. The description of an element as a "first" element may not require or imply the presence of a second element or other elements. The terms "first," "second," etc. may also be used herein to differentiate different categories or sets of elements. For conciseness, the terms "first," "second," etc. may represent "first-type (or first-set)," "second-type (or second-set)," etc., respectively.

The singular forms "a," "an" and "the" may represent plural forms as well, unless the context clearly indicates otherwise.

The terms "comprises" and/or "comprising" may specify the presence of stated features or components, but may not preclude the presence or addition of one or more other features or components. When a first element is referred to as being "on" a second element, the first element can be directly or indirectly on the second element. One or more intervening elements may be present between the first element and the second element.

Sizes of elements in the drawings may be exaggerated for convenience of explanation.

The directions D1, D2, and D3 may not be limited to three axes of the orthogonal coordinate system and may or may not be perpendicular to one another.

When a certain embodiment may be implemented differently, a specific process order may be performed differently. For example, two consecutively described processes may be performed substantially at the same time or performed in an order opposite to the described order.

A display apparatus according to an embodiment is an apparatus for displaying images according to input signals and may be, for example, a liquid crystal display (LCD) apparatus, an electrophoretic display apparatus, an organic light-emitting display apparatus, an inorganic electro luminescence (EL) display apparatus, a field emission display (FED) apparatus, a surface-conduction electron-emitter display apparatus, a plasma display apparatus, or a cathode ray display apparatus.

The term "apparatus" may mean "device," The term "fan-out portion" may mean "wire structure" or "wire set." The term "power supply portion" may mean "power supply structure" or "power line structure," The term "connect" may mean "electrically connect." The term "conductive" may mean "electrically conductive." The term "insulate" may mean "electrically insulate." The term "contact" may mean "direct contact" or "directly contact." The term "the same (as)" may mean "equal (to)." An element positioned in an area of a display apparatus may be positioned on (and/or may overlap) a corresponding area of a substrate of the display apparatus. Descriptions with "the second direction (D2)" may be related to structures before a bending area is bent.

Figure 2:
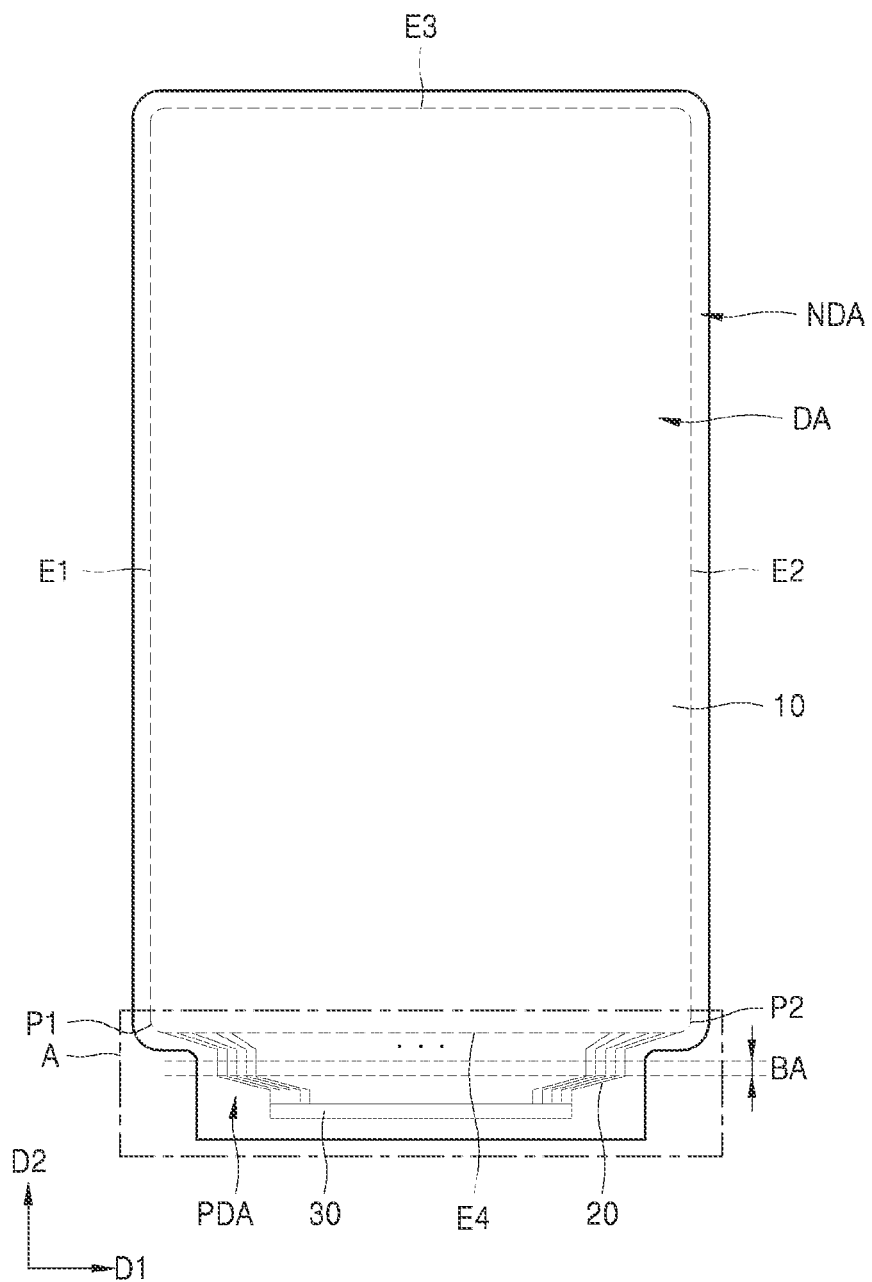
FIG. 2 is a plan view schematically illustrating a part of a display apparatus according to an embodiment.

FIG. 1 is a perspective view schematically illustrating a part of a display apparatus according to an embodiment, and FIG. 2 is a plan view schematically illustrating a part of a display apparatus according to an embodiment.

Referring to FIG. 1, a substrate 100 of a display apparatus 1 may include a display area DA and a non-display area NDA around the display area DA. The non-display area NDA may include a bending area BA that is bent. The display area DA may have a substantially flat surface. The bending area BA of the substrate 100 may be bent based on a bending axis BAX that extends in a first direction D1.

The substrate 100 may include at least one of various flexible, bendable, or rollable materials. For example, the substrate 100 may include polymer resin, such as polyethersulphone (PES), polyacrylate (PAR), polyetherimide (PEI), polyethylene napthalate (PEN), polyethylene terephthalate (PET), polyphenylene sulfide (PPS), polyarylate (PAR), polyimide (PI), polycarbonate (PC), or cellulose acetate propionate (CAP).

The substrate 100 may have a multi-layer structure including two polymer resin layers and an inorganic (e.g., silicon oxide, silicon nitride, or silicon oxynitride) barrier layer between the two polymer resin layers. In an, the substrate 100 may include glass.

In the substrate 100, a width of the bending area BA in the first direction D1 may be less than a width of the display area DA in the first direction D1. A corner portion 100c of the substrate 100 may be round. The display area DA may also have round corners.

Referring to FIG. 2, the display apparatus may include a display area DA, in which a plurality of pixels are positioned, and may include a non-display area NDA outside the display area DA. The non-display area NDA may include a pad area PDA in which an integrated circuit (IC) and/or a printed circuit board (PCB) may be disposed. Areas DA, NDA, BA, and FDA of the display apparatus may correspond to areas DA, NDA, BA, and FDA of the substrate 100.

FIG. 2 may illustrate a plan view of the substrate 100 in a manufacturing process of the display apparatus. In a finally-manufactured display apparatus or an electronic device (such as a smartphone) including the display apparatus, in order to minimize the area of the non-display area NDA, a part of the substrate 100 may be bent, as shown in FIG. 1. For example, the substrate 100 may be bent based on the bending axis BAX parallel to the first direction D1.

At least a part of the pad area FDA may overlap the display area DA. The pad area FDA may be positioned behind the display area DA.

The display area DA may have a substantially rectangular or square shape. The display area DA may include a first edge E1 and a second edge E2 opposite each other and may include a third edge E3 and a fourth edge E4 opposite each other and between the first edge E1 and the second edge E2. The pad area PDA is adjacent to the fourth edge E4. A first portion P1 of the display area DA that connects the first edge E1 to the fourth edge E4 may be round. A second portion P2 of the display area DA that connects the second edge E2 to the fourth edge E4 may be round. Other portions of the display area DA may be round.

A display unit 10 including a plurality of pixels may be positioned in the display area DA. A fan-out portion 20 including conductive lines may be positioned in the pad area FDA. One side of the fan-out portion 20 may be connected to the display unit 10, and the other side of the fan-out portion 20 may be connected to a driving circuit portion 30. The driving circuit portion 30 may include an IC.

Figure 3:
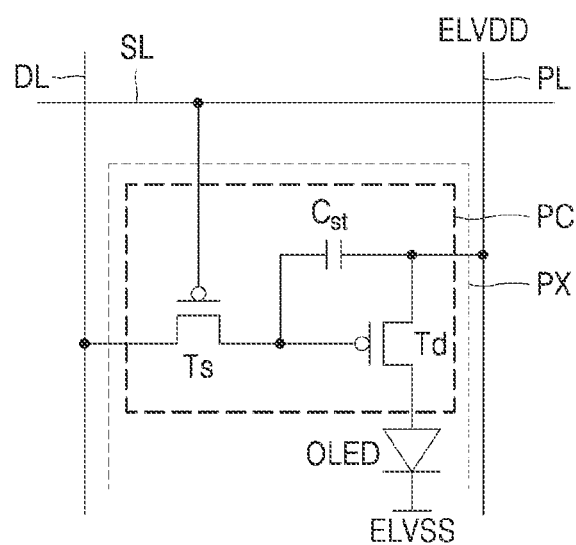
FIG. 3 is a circuit diagram schematically illustrating a pixel of a display apparatus according to an embodiment.

FIG. 3 is a circuit diagram schematically illustrating a pixel of a display apparatus according to an embodiment.

Referring to FIG. 3, a pixel PX may include a pixel circuit PC connected to a scan line SL and a data line DL and may include an organic light-emitting device (OLED) connected to the pixel circuit PC. The pixel circuit PC may include a driving thin-film transistor (TFT) Td, a switching TFT Ts, and a storage capacitor Cst. The switching TFT Ts may be connected to the scan line SL and the data line DL and may transmit data signals input through the data line DL according to scan signals input through the scan line SL.

The storage capacitor Cst may be connected to the switching TFT Ts and a driving voltage line PL and may store a voltage that corresponds to a difference between a voltage transmitted from the switching TFT Ts and a driving voltage ELVDD supplied to the driving voltage line PL.

The driving TFT Td may be connected to the driving voltage line PL and the storage capacitor Cst and may control a driving current that flows through the OLED from the driving voltage line PL in response to a value of the voltage stored in the storage capacitor Cst. The OLED may emit light having certain brightness due to the driving current. The OLED may emit red, green, blue or white light, for example.

In FIG. 3, the pixel PX includes two TFTs and one storage capacitor. In an embodiment, the pixel circuit PC of the pixel PX may include three or more TFTs or two or more storage capacitors.

Figure 4:
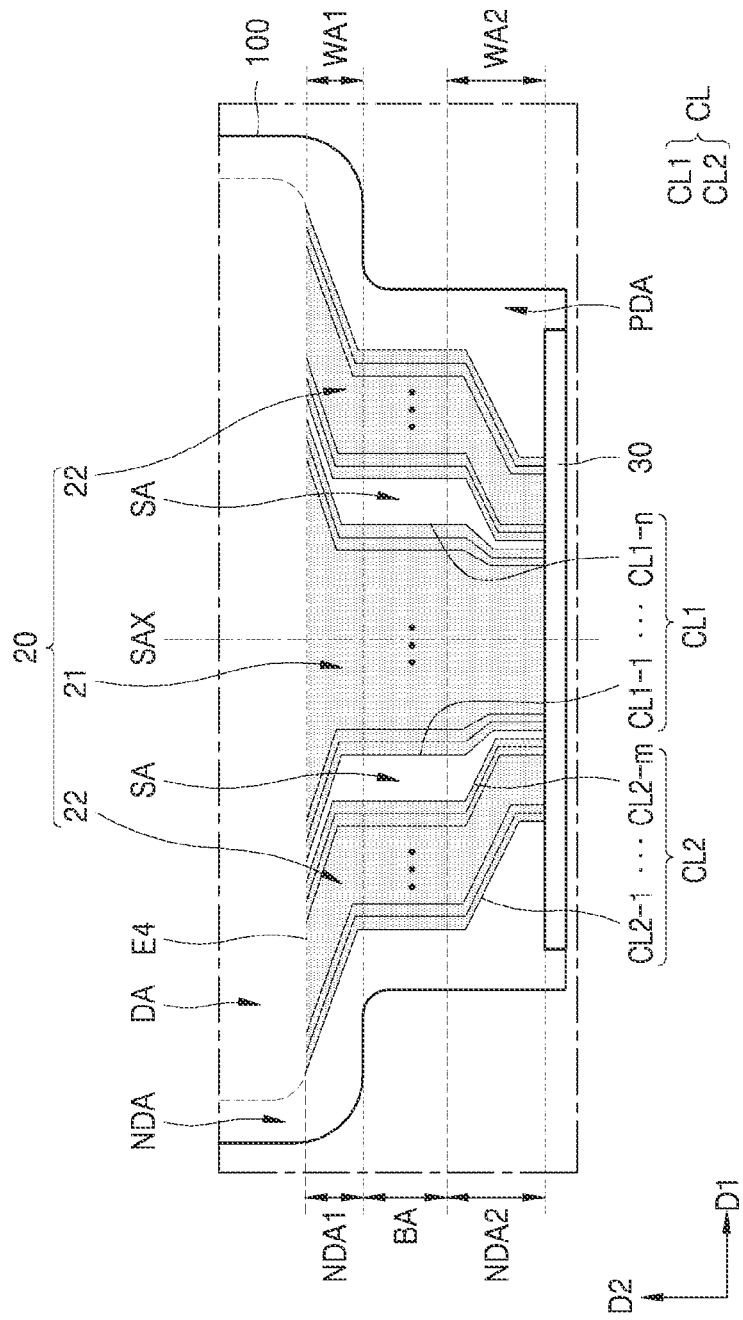
FIG. 4 is a plan view schematically illustrating a region A of FIG. 2 according to an embodiment.

FIG. 4 is a plan view schematically illustrating a region A of FIG. 2.

Referring to FIG. 4, the non-display area NDA may include a first non-display area NDA1, a second non-display area NDA2, and a bending area BA.

The first non-display area NDA1 and the second non-display area NDA2 may be positioned at opposite sides of the bending area BA. The first non-display area NDA1 is an area between the display area DA and the second non-display area NDA2. The second non-display area NDA2 is not recognized from the front of the display apparatus after the bending area BA has been bent and is between the bending area BA and the driving circuit portion 30. The bending area BA may be positioned between the first non-display area NDA1 and the second non-display area NDA2.

The first non-display area NDA1 may be recognized by the user of an electronic device, such as a finally-manufactured display apparatus or a smartphone including the display apparatus. The fan-out portion 20 is positioned in the first non-display area NDA1.

According to an embodiment, the fan-out portion 20 includes a plurality of sections (or wire sets) such that a width WA1 of the first non-display area NDA1 may be reduced. The sections may be spaced from one another by a separation area SA in FIG. 4 and may include a first fan-out portion 21 and a second fan-out portion 22.

As shown in FIG. 4, the fan-out portion 20 may include the first fan-out portion 21 and the second fan-out portion 22 in the bending area BA with the separation area SA between the first fan-out portion 21 and the second fan-out portion 22. The separation area SA may be positioned over a portion of each of the bending area BA, the first non-display area NDA1, and the second non-display area NDA2.

The fan-out portion 20 may include a plurality of conductive lines CL. The plurality of conductive ones CL may include, for example, a data line DL that transmits data signals applied from the driving circuit portion 30 to the display unit 10.

The plurality of conductive lines CL may be positioned on the first non-display area NDA1, the bending area BA, and the second non-display area NDA2. In a plan view, as shown in FIG. 4, the plurality of conductive lines CL may be bent at least twice. A first bend of each of the conductive lines CL may be positioned in the first non-display area NDA1, and a second bend of each of the conductive lines CL may be positioned in the second non-display area NDA2. Because stress is concentrated on the bending area BA, the bends of the conductive lines CL may avoid the bending area BA, for preventing unwanted short-circuit.

Sections of the conductive lines CL may extend obliquely relative to the first direction D1 and the second direction D2 in the first non-display area NDA1 and the second non-display area NDA2. Advantageously, the widths WA1 and WA2 may be minimized. The width of the pad area FDA in the first direction D1 may also be minimized, Sections of the conductive lines CL may extend parallel to the second direction 02 in the bending area BA before the bending area BA is bent.

The first fan-out portion 21 may be positioned between second fan-out portions 22. The fan-out portion 20 may have a symmetrical shape. The first fan-out portion 21 may be symmetrical and may be positioned between the second fan-out portions 22. The second fan-out portions 22 may be mirror images to each other based on a symmetry axis SAX.

The first fan-out portion 21 may include a plurality of first conductive lines CL1. The plurality of first conductive lines CL1 may include n first conductive lines including a conductive line CL1-1 through a conductive line CL1-$n$. A second fan-out portion 22 may include a plurality of second conductive lines CL2. The plurality of second conductive lines CL2 may include m second conductive lines including a conductive line CL2-1 through a conductive line CL2-$m$. The number of first conductive lines CL1 and the number of second conductive lines CL2 may be the same or different from each other.

Figure 5:
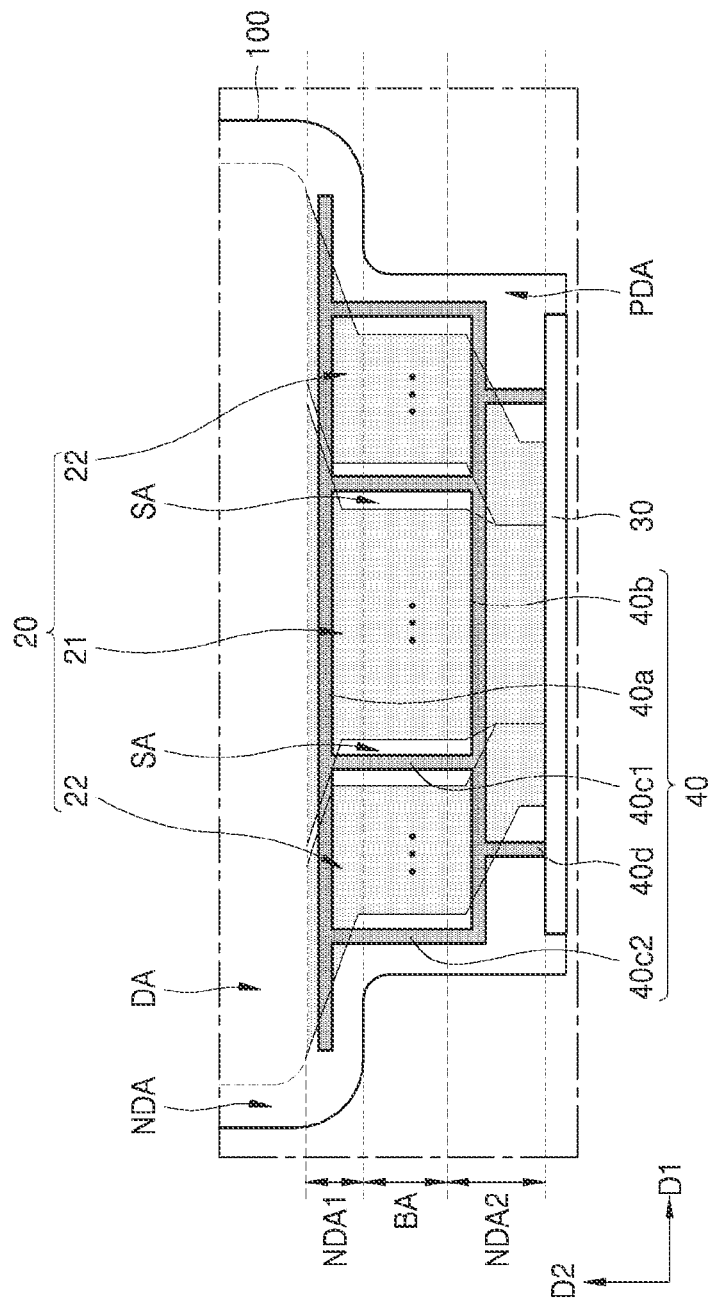
FIG. 5 is a plan view schematically illustrating a part of a display apparatus according to an embodiment.
Figure 6:
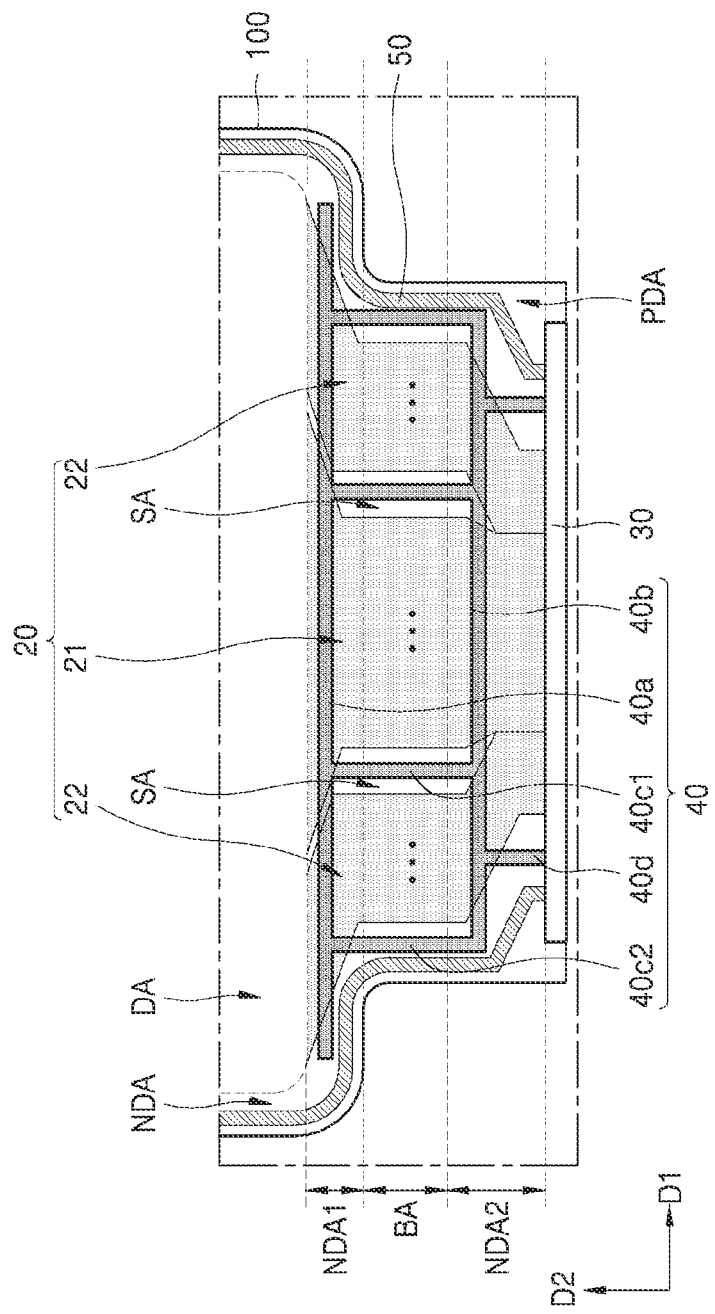
FIG. 6 is a plan view schematically illustrating a part of a display apparatus according to an embodiment.

FIGS. 5 and 6 are plan views schematically illustrating a part of a display apparatus according to one or more embodiments. FIG. 5 is a plan view in which a first power supply portion is added to the structure of HG. 4, and FIG. 6 is a plan view in which a second power supply portion is added to the structure of FIG. 5.

Referring to FIG. 5, a display apparatus may include a first power supply portion 40 having a multi-line structure. In a multi-line structure, two or more connection lines may connect a conductive line in the first non-display area NDA1 to a conductive line in the second non-display area NDA2 and may be symmetrically arranged. Two connection lines including a first connection line and a second connection line may be positioned in the fan-out area FDA (which may include and/or correspond to the second non-display area NDA2).

The first power supply portion 40 may include a first conductive line 40$a$, a second conductive line 40$b$, and a first connection line 40$c$1 and a second connection line 40$c$2 that connect the first conductive line 40$a$ to the second conductive line 40$b$. The first power supply portion 40 may be an electrode power-supplying wiring structure that supplies a driving power to the driving TFT Td of FIG. 3.

The first conductive line 40$a$ and the second conductive line 40$b$ may extend in a first direction D1, as shown in FIG. 5. The first conductive line 40$a$ may be positioned in the first non-display area NDA1, and the second conductive line 40$b$ may be positioned in the second non-display area NDA2. A pad line 40$d$ may be positioned in the second non-display area NDA2, may be connected to the second conductive line 40$b$, and may supply power to the first power supply portion 40.

The first connection line 40$c$1 and the second connection line 40$c$2 may extend in the second direction D2 different from the first direction D1. For example, the second direction D2 may perpendicular to the first direction D1. The first connection line 40$c$1 and the second connection line 40$c$2 may be arranged in the bending area BA and may extend to the first non-display area NDA1 and the second non-display area NDA2 so as to connect the first conductive line 40$a$ to the second conductive line 40$b$.

At least a part of the first connection line 40$c$1 may be positioned in the separation area SA between the first fan-out portion 21 and the second fan-out portion 22. The part of the first connection line 40$c$1 may not overlap the fan-out portion 20.

The first connection line 40$c$1 may not overlap both the first fan-out portion 21 and the second fan-out portion 22. The first connection line 40$c$1 and the first and second fan-out portions 21 and 22 may be positioned on the same layer in the bending area BA, and the first connection line 40$c$1 may be spaced from the first fan-out portion 21 and the second fan-out portion 22. The first conductive line 40$a$ and the second conductive line 40$b$ may overlap the first and second fan-out portions 21 and 22.

The second connection line 40$c$2 may be positioned outside the fan-out portion 20. The second connection line 40$c$2 may be positioned outside the second fan-out portion 22. The second connection line 40$c$2 may not overlap the second fan-out portion 22 in the bending area BA. In an embodiment, the second connection line 40$c$2 may be positioned in the separation area SA and may be parallel to the first connection line 40$c$1.

Two or more of the first conductive line 40$a$, the second conductive line 40$b$, the first and second connection lines 40$c$1 and 40$c$2, and a pad line 40$d$ may be formed from the same conductive layer and may be formed in the same process.

Referring to FIG. 6, a second power supply portion 50 is positioned in the non-display area NDA, The second power supply portion 50 may be positioned outside the first power supply portion 40. Although not shown, the second power supply portion 50 may substantially surround the display area DA. The second power supply portion 50 may be a common power supply wiring structure that supplies a common power to of the display unit 10.

In FIG. 6, the second power supply portion 50 may not overlap the fan-out portion 20. In an embodiment, the second power supply portion 50 may overlap the fan-out portion 20 only in the first non-display area NDA1.

Because the first power supply portion 40 has a multi-line structure, heat of wires may be effectively distributed and dissipated. Advantageously, luminous uniformity of the display unit 10 may be optimized. The multi-line structure of the first power supply portion 40 and the oblique sections of the fan-out portion may advantageously enable minimization of a width of the non-display area NDA.

Figure 7:
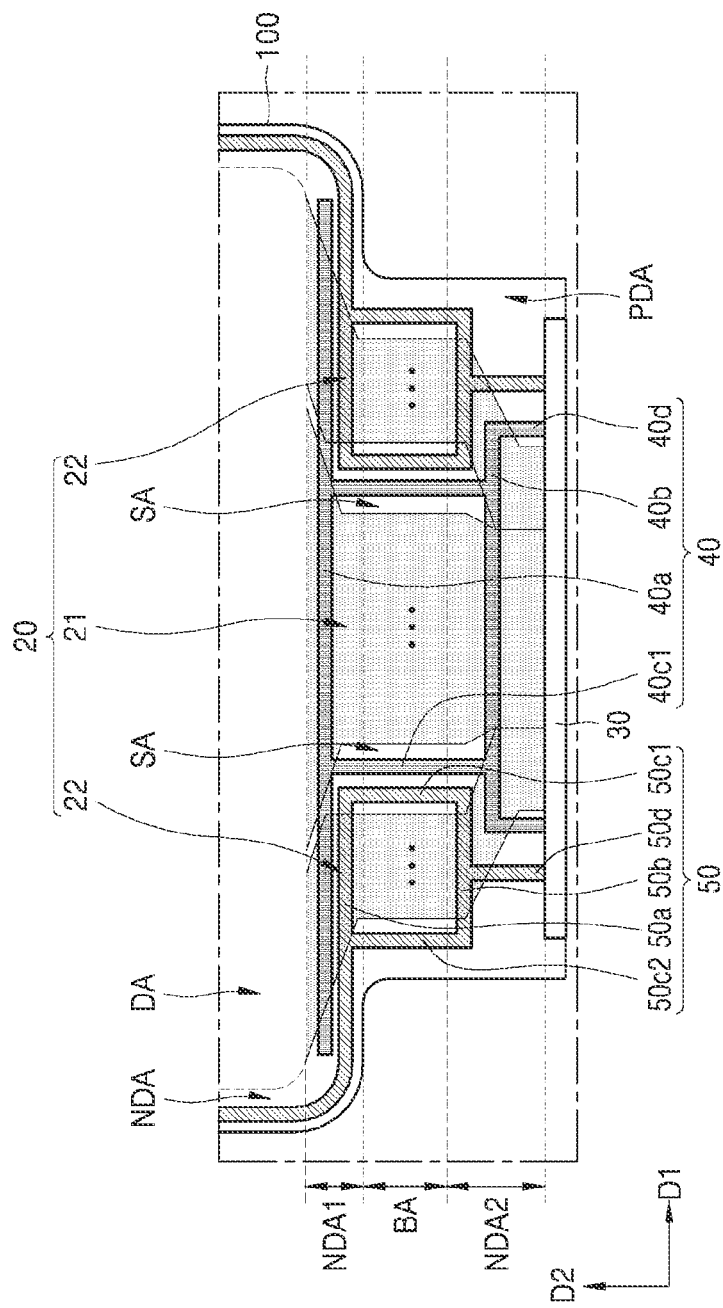
FIG. 7 is a plan view illustrating a part of a display apparatus according to another embodiment.

FIG. 7 is a plan view illustrating a part of a display apparatus according to an embodiment. FIG. 7 is different from FIG. 6 in the structure of the first power supply portion 40 and the second power supply portion 50. Differences between FIGS. 6 and 7 are described.

Referring to FIG. 7, the display apparatus includes a second power supply portion 50 having a multi-line structure.

The fan-out portion 20 may include a first fan-out portion 21 and a second fan-out portion 22. In the bending area BA, a separation area SA may be positioned between the first fan-out portion 21 and the second fan-out portion 22.

The first power supply portion 40 may include a first conductive line 40$a$, a second conductive line 40$b$, a first connection line 40$c$1 that connects the first conductive line 40$a$ to the second conductive line 40$b$, and a pad line 40$d$. The first conductive line 40$a$ and the second conductive line 40$b$ may extend in the first direction D1. The first conductive line 40$a$ may be positioned in the first non-display area NDA1, and the second conductive line 40$b$ may be positioned in the second non-display area NDA2.

The first connection line 40$c$1 may extend in the second direction D2 different from the first direction D1. The first connection line 40$c$1 may be positioned in the bending area BA and may extend into the first non-display area NDA1 and the second non-display area NDA2 so as to connect the first conductive line 40$a$ to the second conductive line 40$b$.

The second power supply portion 50 may include a third conductive line 50$a$, a fourth conductive line 50$b$, and a third connection line 50$c$1 and a fourth connection line 50$c$2 that connect the third conductive line 50$a$ to the fourth conductive line 50$b$.

The third conductive line 50a and the fourth conductive line 50b may extend in the first direction D1. The third and fourth conductive lines 50a and 50b may be oriented substantially parallel to the first conductive line 40a and the second conductive line 40b. The third conductive line 50a may be positioned in the first non-display area NDA1, and the fourth conductive line 50b may be positioned in the second non-display area NDA2.

The third connection line 50c1 and the fourth connection line 50c2 may extend in the second direction D2, The third connection line 50c1 and the fourth connection line 50c2 may be positioned in the bending area BA and may extend into the first non-display area NDA1 and the second non-display area NDA2 so as to connect the third conductive line 50a to the fourth conductive line 50b.

The pad line 50d may extend in the second direction D2 in the second non-display area NDA2. The pad line 50d may be connected to the fourth conductive line 50b and may supply power to the second power supply portion 50.

At least a part of the first connection line 40c1 and the third connection line 50c1 may be positioned in the separation area SA between the first fan-out portion 21 and the second fan-out portion 22. The part of the first connection line 40c1 and the third connection line 50c1 may not overlap the fan-out portion 20.

The first connection line 40c1 and the third connection line 50c1 may be positioned on the same layer. The first connection line 40c1 and the third connection line 50c1 may be apart from one another by a predetermined distance. The first connection line 40c1 and the third connection line 50c1 may not overlap the fan-out portion 20 in the bending area BA. The first connection line 40c1 may not overlap both the first fan-out portion 21 and the second fan-out portion 22 in the bending area BA.

The fourth connection line 50c2 of the second power supply portion 50 may be positioned at an outer edge of the fan-out portion 20. The fourth connection line 50c2 may be positioned not to overlap the fan-out portion 20 and may not overlap the second fan-out portion 22.

Because the second power supply portion 50 has the multi-line structure, heat of wires may be effectively distributed and dissipated. Advantageously, luminous uniformity of the display unit 10 may be optimized. The multi-line structure of the second power supply portion 50 and the oblique sections of the fan-out portion 20 may enable minimization of a width of the non-display area NDA.

Figure 8:
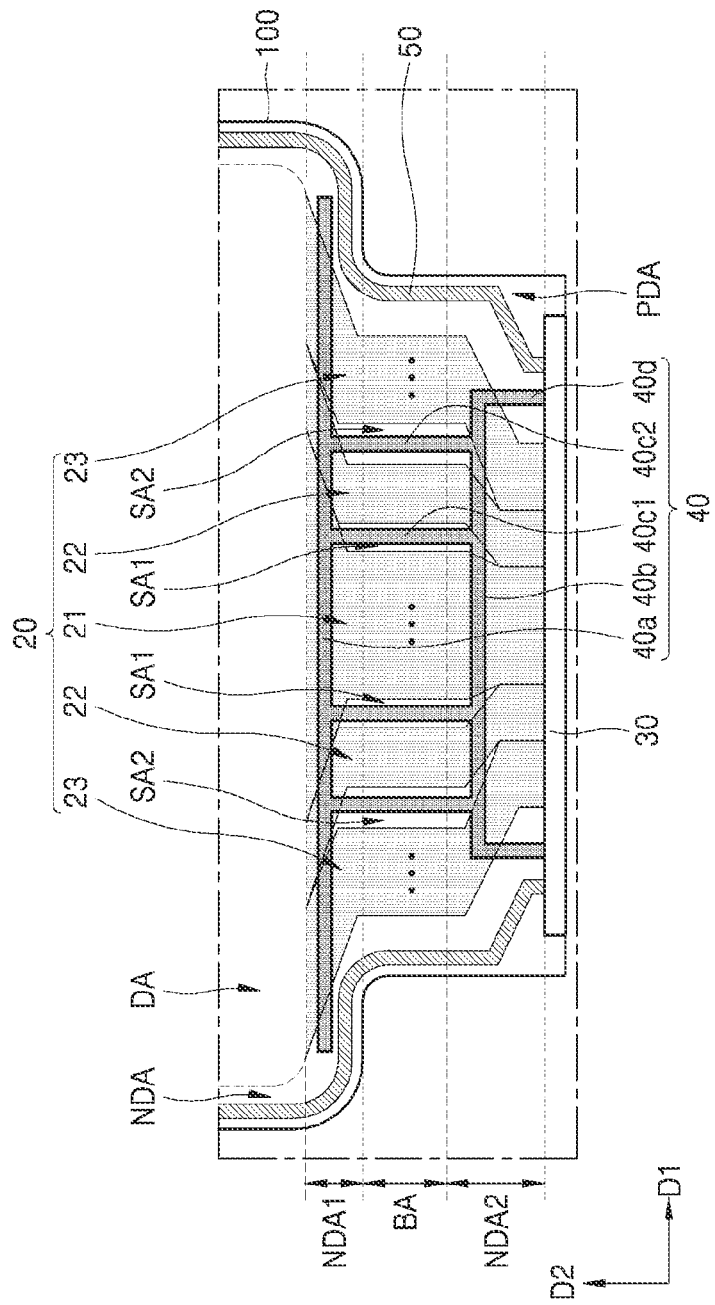
FIG. 8 is a plan views illustrating a part of a display apparatus according to an embodiment.
Figure 9:
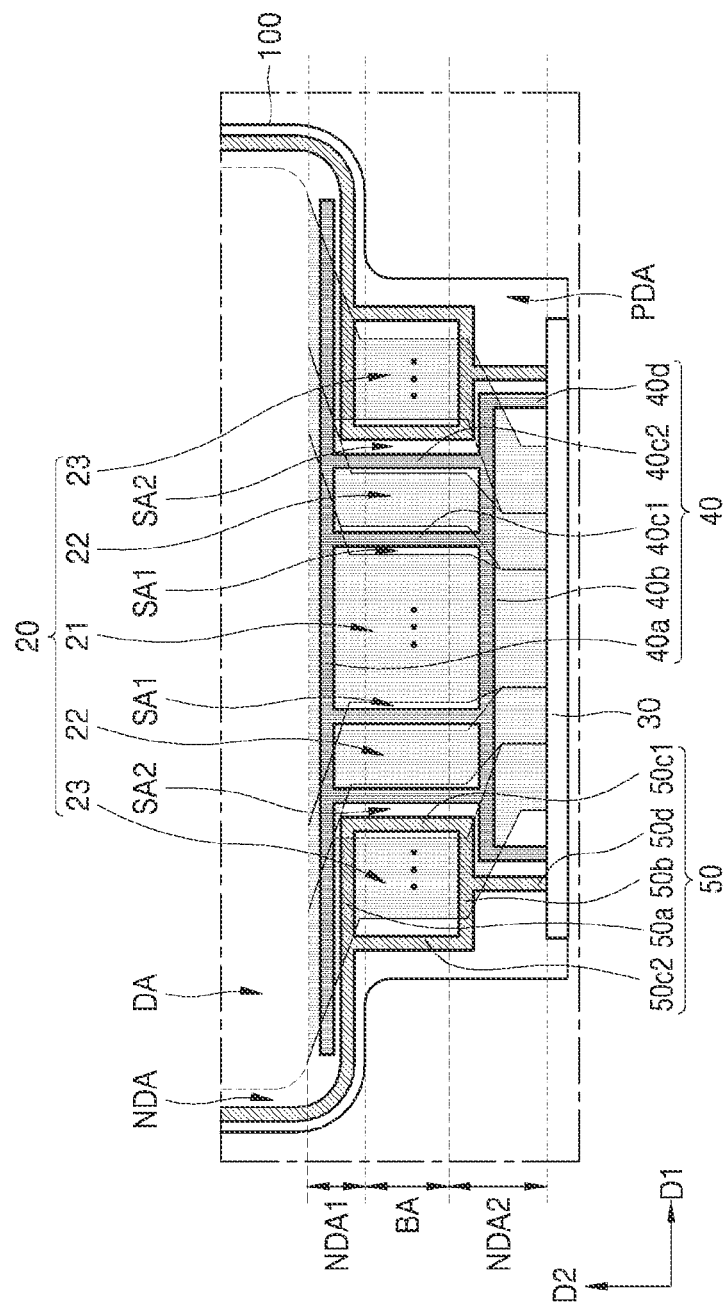
FIG. 9 is a plan views illustrating a part of a display apparatus according to an embodiment.

FIGS. 8 and 9 are plan views illustrating a part of a display apparatus according to one or more embodiments. FIGS. 8 and 9 are different from FIG. 6 in the structure of the fan-out portion 20, the first power supply portion 40, and the second power supply portion 50.

Referring to FIGS. 8 and 9, the fan-out portion 20 may include a first fan-out portion 21, two second tan-out portions 22, and two third fan-out portions 23, The first fan-out portion 21 may be positioned in the center of the fan-out portion 20, and the second tan-out portions 22 may be positioned at two opposite sides (left and right) of the first fan-out portion 21, and the third fan-out portion 23 may be positioned at two opposite sides of the two second fan-out portions 22.

The first fan-out portion 21 and a second fan-out portion 22 may be separated by a first separation area SA1 in the bending area BA. The first fan-out portion 21 and the second fan-out portion 22 may be close to each other in an area outside the bending area BA. Outside the bending area BA, the first fan-out portion 21 and the second tan-out portion 22 may be significantly separated by the same distance as a distance between conductive lines in each of the fan-out portions 21 and 22.

A second fan-out portion 22 and a third fan-out portion 23 may be significantly separated by a second separation area SA2 in the bending area BA. The second fan-out portion 22 and the third fan-out portion 23 may be close to each other in outside the bending area BA.

The first separation area SA1 and the second separation area SA2 may be positioned mostly in the bending area BA, and a portion of the first separation area SA1 and the second separation area SA2 may extend into the first non-display area NDA1 and the second non-display area NDA2. In FIGS. 8 and 9, a width of the first separation area SA1 in the first direction D1 may be less than a width of the second separation area SA2 in the first direction D1. In embodiments, the widths of the first separation area SA1 and the second separation area SA2 may be the same, or the width of the first separation area SA1 may be greater than the width of the second separation area SA2.

Referring to FIG. 8, the display apparatus includes a first power supply portion 40 having a multi-line structure. The first power supply portion 40 may include a first conductive line 40a, a second conductive line 40b, a first connection line 40c1 that connects the first conductive line 40a to the second conductive line 40b, a second connection line 40c2, and a pad line 40d.

The first conductive line 40a and the second conductive line 40b may extend in the first direction D1. The first conductive line 40a may be positioned in the first non-display area NDA1, and the second conductive line 40b may be positioned in the second non-display area NDA2.

The first connection line 40c1 and the second connection line 40c2 may extend in the second direction D2.

The first connection line 40c1 and the second connection line 40c2 may be positioned in the bending area BA and may extend into the first non-display area NDA1 and the second non-display area NDA2 so as to connect the first conductive line 40a to the second conductive line 40b.

The first connection line 40c1 and the second connection line 40c2 may not overlap the fan-out portion 20 in the bending area BA. The first connection line 40c1 and the second connection line 40c2 may not overlap the first fan-out portion 21 and the second fan-out portion 22 in the bending area BA. The first connection line 40c1 and the second connection line 40c2 may overlap the fan-out portion 20 in the first non-display area NDA1 and the second non-display area NDA2.

The first connection line 40c1 may be positioned in the first separation area SA1 between the first fan-out portion 21 and the second fan-out portion 22, and the second connection line 40c2 may be positioned in the second separation area SA2 between the second fan-out portion 22 and the third fan-out portion 23.

The second power supply portion 50 is positioned in the non-display area NDA. The second power supply portion 50 may be positioned at an outer edge of the first power supply portion 40. Although not shown, the second power supply portion 50 may substantially surround the display area DA.

In FIG. 8, the second power supply portion 50 may not overlap the fan-out portion 20. In an embodiment, the second power supply portion 50 may overlap the fan-out portion 20 only in the first non-display area NDA1.

Because the first power supply portion 40 has the multi-line structure, heat of wires may be effectively distributed and dissipated. Advantageously, and luminous uniformity of the display unit 10 may be optimized. The multi-line structure of the second power supply portion 50 and the oblique sections of the fan-out portion 20 may enable minimization of a width of the non-display area NDA.

The display apparatus of FIG. 9 is similar to the display apparatus of FIG. 8 and includes the first power supply portion 40 and the second power supply portion 50 having multi-line structures.

The second power supply portion 50 may include a third conductive line 50a, a fourth conductive line 50b, and a third connection line 50c1 and a fourth connection line 50c2 that connect the third conductive line 50a to the fourth conductive line 50b.

The third conductive line 50a and the fourth conductive line 50b may extend in the first direction D1. The third and fourth conductive lines 50a and 50b may be oriented substantially parallel to the first conductive line 40a and the second conductive line 40b. The third conductive line 50a may be positioned in the first non-display area NDA1, and the fourth conductive line 50b may be positioned in the second non-display area NDA2.

The third connection line 50c1 and the fourth connection line 50c2 may extend in the second direction D2. The third connection line 50c1 and the fourth connection line 50c2 may be positioned in the bending area BA and may extend into the first non-display area NDA1 and the second non-display area NDA2 so as to connect the third conductive line 50a to the fourth conductive line 50b.

The pad line 50d may extend in the second direction D2 in the second non-display area NDA2, The pad line 50d may be connected to the fourth conductive line 50b and may supply power to the second power supply portion 50.

A second connection line 40c2 of the first power supply portion 40 and a third connection line 50c1 of the second power supply portion 50 may be positioned in a second separation area SA2. The second connection line 40c2 and the third connection line 50c1 may be spaced from each other by a predetermined distance and may be parallel to each other. The second connection line 40c2 and the third connection line 50c1 may not overlap both the second fan-out portion 22 and the third fan-out portion 23 in the bending area BA.

The fourth connection line 50c2 of the second power supply portion 50 may be placed at an outer edge of the fan-out portion 20. The fourth connection line 50c2 may not overlap the fan-out portion 20.

Because the first power supply portion 40 and the second power supply portion 50 have the multi-line structure, heat of wires may be effectively distributed and dissipated. Advantageously, luminous uniformity of the display unit 10 may be optimized. The multiline structures of the power supply portions 40 and 50 and the oblique sections of the fan-out portion 20 may enable minimization of a width of the non-display area NDA.

Figure 10:
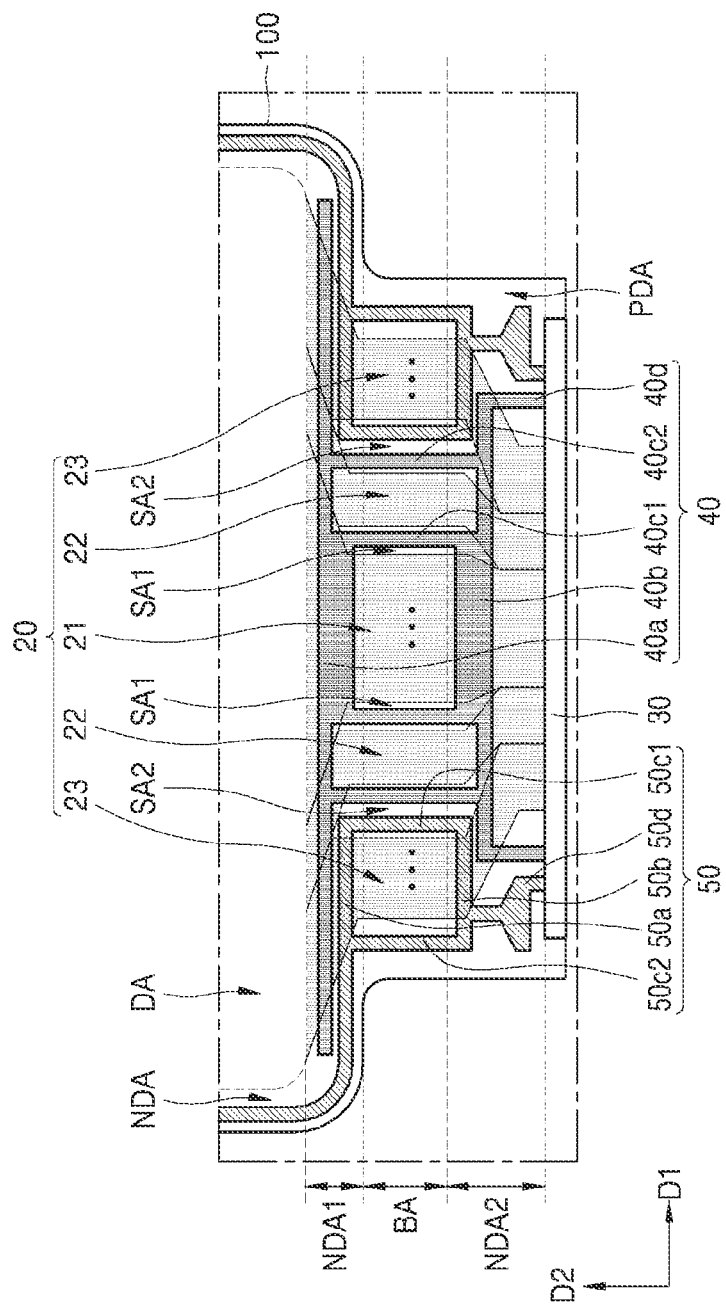
FIG. 10 is a plan views illustrating a part of a display apparatus according to an embodiment.

In embodiments, widths of lines included in each of the first power supply portion 40 and the second power supply portion 50 may be the same in all areas. In embodiments, the widths of lines of the first power supply portion 40 and the second power supply portion 50 may be different in some parts, as shown in FIG. 10. The line widths may be configured to minimize resistance of the first power supply portion 40 and/or the second power supply portion 50.

Line widths of the first power supply portion 40 and the second power supply portion 50 in the bending area BA may be limited by the width of the separation area SA. Line widths of the first power supply portion 40 and the second power supply portion 50 in the first non-display area NDA1 and the second non-display area NDA2 may be widened.

This is because the first power supply portion 40 and the second power supply portion 50 and the fan-out portion 20 in the first non-display area NDA1 and the second non-display area NDA2 are positioned on different layers.

The line widths of the first power supply portion 40 and the second power supply portion 50 may be configured to avoid other elements and structures.

Figure 17:
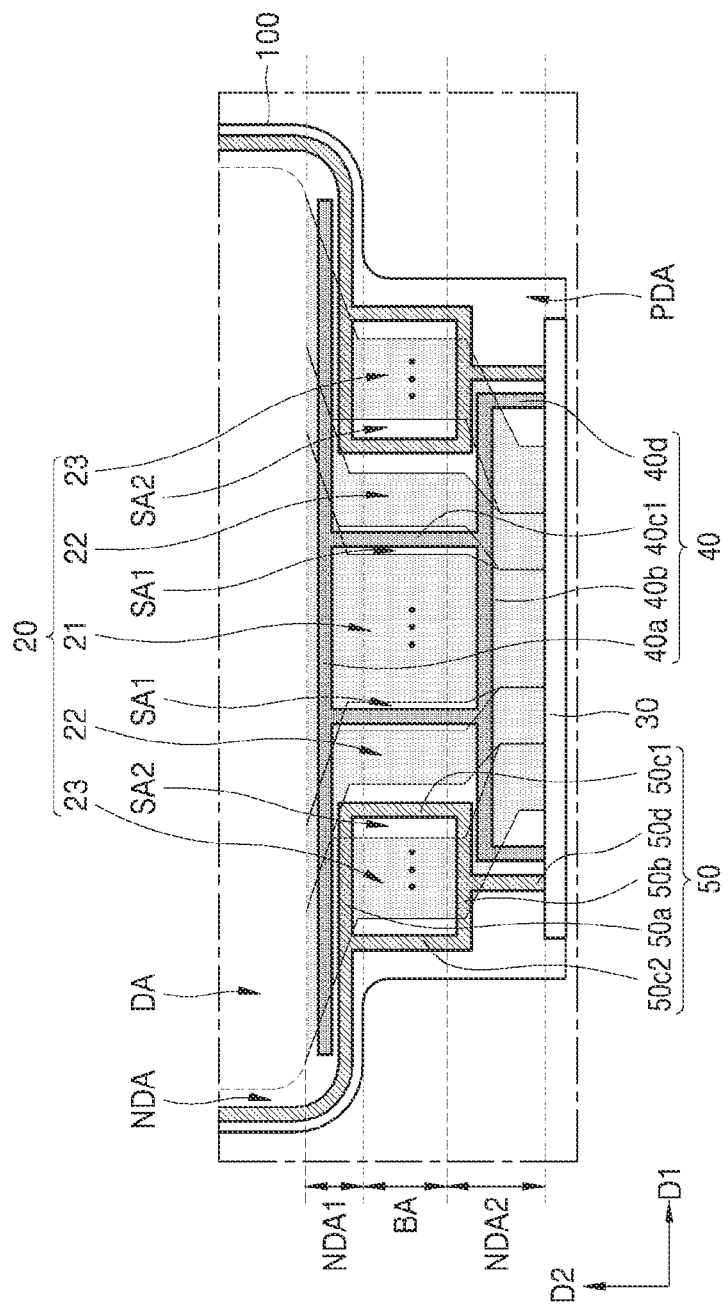
FIG. 17 is a plan view schematically illustrating a part of a display apparatus according to an embodiment.

FIG. 17 illustrates an embodiment which is similar to an embodiment of FIG. 9. In FIG. 17, a first connection line 40c1 of the first power supply portion 40 may be positioned in a first separation area SA1, and a third connection line 50c1 of the second power supply portion 50 may be positioned in a second separation area SA2. A fourth connection line 50c2 of the second power supply portion 50 may be positioned outside the fan-out portion 20.

Figure 11:
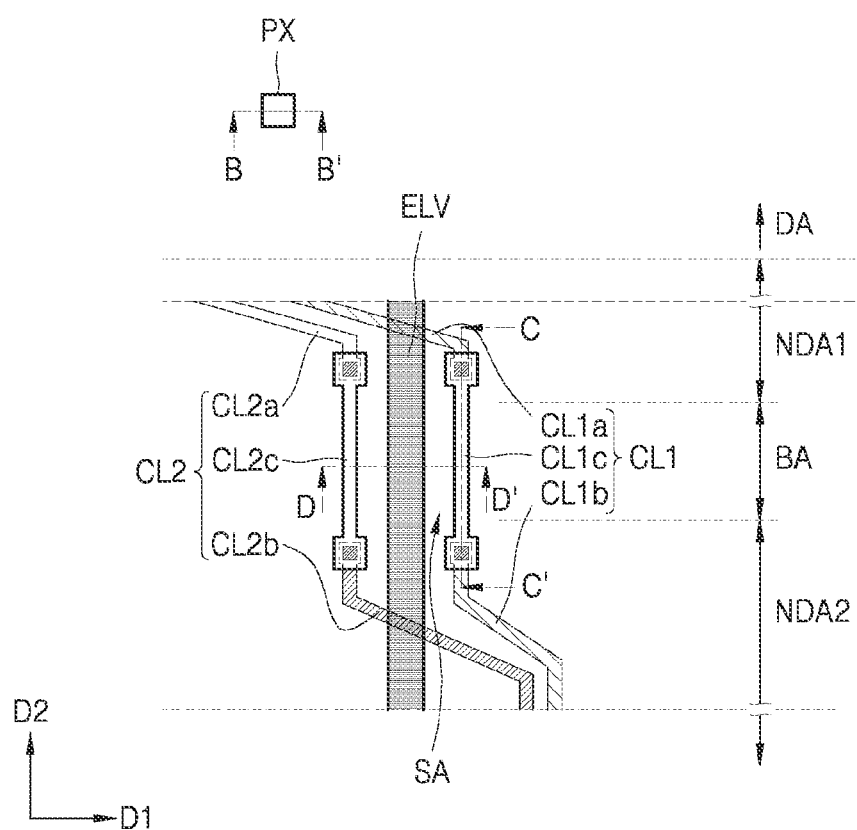
FIG. 11 is a plan view schematically illustrating a part of a display apparatus according to an embodiment.
Figure 12:
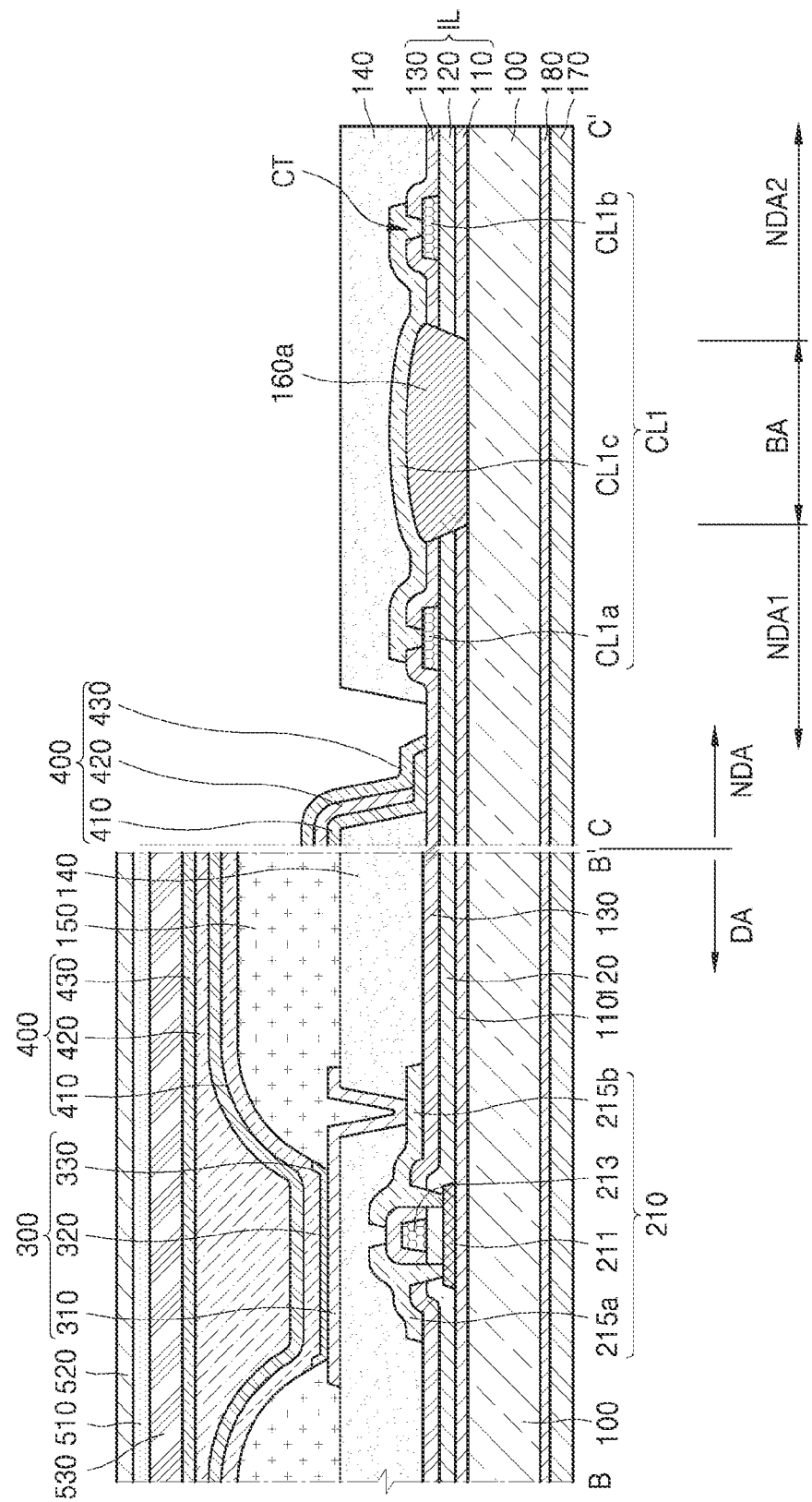
FIG. 12 is a cross-sectional view schematically illustrating a part of a display apparatus according to an embodiment.
Figure 13:
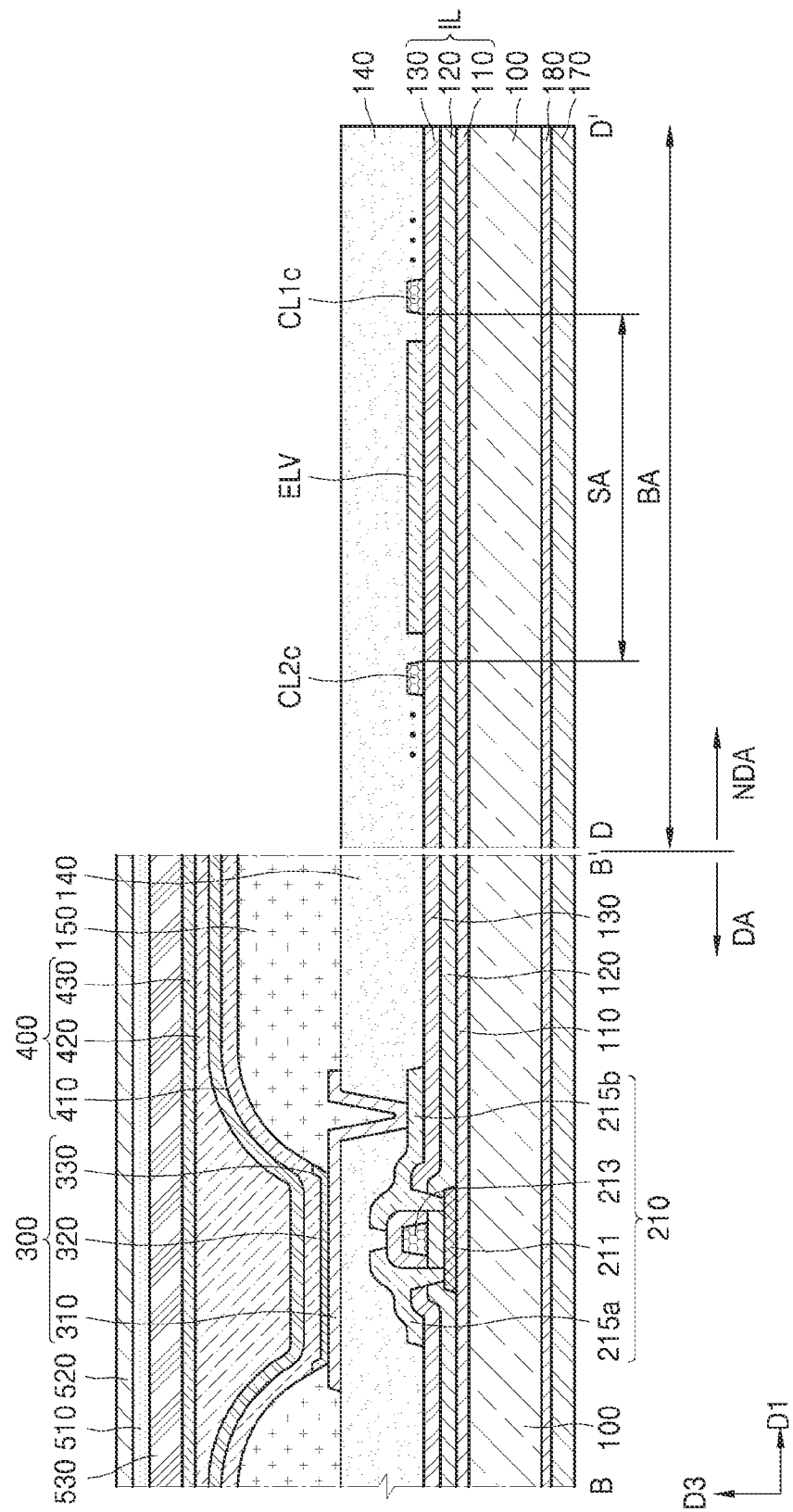
FIG. 13 is a cross-sectional view schematically illustrating a part of a display apparatus according to an embodiment.

FIG. 11 is a plan view schematically illustrating a part of a display apparatus according to an embodiment, and FIGS. 12 and 13 are cross-sectional views schematically illustrating a part of a display apparatus according to at least an embodiment. FIG. 12 corresponds to a cross-section taken along lines B-B' and C-C' of FIG. 11, and FIG. 13 corresponds to a cross-section taken along lines B-B' and D-D' of FIG. 11.

Referring to FIG. 12, a TFT 210 may be electrically connected to an OLED 300 and may also be positioned in the display area DA. A pixel electrode 310 of the OLEO 300 is electrically connected to the TFT 210.

A TFT (not shown) may be positioned in the non-display area NDA. The TFT placed in the non-display area NDA may be a part of a circuit unit for controlling electrical signals applied to the display area DA.

The TFT 210 may include a semiconductor layer 211, a gate electrode 213, a source electrode 215a, and a drain electrode 215b including amorphous silicon, polycrystalline silicon, or an organic semiconductor material.

In order to insulate between the semiconductor layer 211 and the gate electrode 213, the gate insulating layer 120 may be between the semiconductor layer 211 and the gate electrode 213, the gate insulating layer 120 including an inorganic material such as silicon oxide, silicon nitride and/or silicon oxynitride. Furthermore, an interlayer insulating layer 130 may be positioned on the gate electrode 213, the interlayer insulating layer 130 including an inorganic material such as silicon oxide, silicon nitride and/or silicon oxynitride, and a source electrode 215a and a drain electrode 215b may be positioned on the interlayer insulating layer 130. An insulating layer including an inorganic material may be formed through chemical vapor deposition (CVD) or atomic layer deposition (ALD).

A buffer layer 110 may be between the TFT 210 and the substrate 100. The buffer layer 110 may include an inorganic material such as silicon oxide, silicon nitride, and/or silicon oxynitride. The buffer layer 110 may improve smoothness of a top surface of the substrate 100 and may prevent impurities from penetrating into the semiconductor layer 211 of the TFT 210.

A planarization layer 140 may be positioned on the TFT 210. The planarization layer 140 may planarize a surface over the TFT 210.

The planarization layer 140 may be formed of an organic material such as acryl, benzocyclobutene (BCB) or hexamethyldisiloxane (HMDSO). The planarization layer 140 may be a single layer or may have a multi-layer structure. As illustrated in FIG. 12, the planarization layer 140 has an opening outside the display area DA so that a portion of the planarization layer 140 of the display area DA and a portion of the planarization layer 140 of the non-display area NDA may be physically separated from each other. This is to prevent impurities from reaching the display area DA through the planarization layer 140.

In the display area DA, the OLED 300 may be positioned on the planarization layer 140. The OLED 300 may include the pixel electrode 310, a common electrode 330, and an intermediate layer 320 (including an emission layer) between the pixel electrode 310 and the common electrode 330.

The pixel electrode 310 may be in contact with one of the source electrode 215a and the drain electrode 215b through a contact hole formed in the planarization layer 140 and may be electrically connected to the TFT 210.

A pixel-defining layer 150 may be disposed on the planarization layer 140. The pixel-defining layer 150 has an opening exposing at least the central part of the pixel electrode. The pixel-defining layer 150 increases a distance between edges of the pixel electrode 310 and the common electrode 330, thereby preventing an arc from occurring in the edges of the pixel electrode 310. The pixel-defining layer 150 may be formed of an organic material such as polyimide or HMDSO.

The intermediate layer 320 of the OLED 300 may include a small molecular weight material or a polymer material. When the intermediate layer 320 includes a small molecular weight material, the intermediate layer 320 may include a hole injection layer (HIL), a hole transport layer (HTL), an emission layer (EML), an electron transport layer (ETL) and an electron injection layer (EIL) stacked in a composite structure. The intermediate layer 320 may include one or more organic materials, such as one or more of copper phthalocyanine (CuPc), N,N'-Di(naphthalene-1-yl)-N,N'-diphenyl-benzidine (NPB), and tris-8-hydroxyquinoline aluminum)(Alq3). Layers of the intermediate layer 320 may be formed through vacuum deposition.

When the intermediate layer 320 includes a polymer material, the intermediate layer 320 may include a HTL and an EML. The HTL may include poly-3,4-alkenedioxythiophene (PEDOT), and the EML may include a poly-phenylenevinylene (PPV)-based and/or polyfluorene-based polymer material. The intermediate layer 320 may be formed through screen printing, ink-jet printing or laser induced thermal imaging (LITI).

The common electrode 330 may cover the display area DA. The common electrode 330 may correspond to a plurality of pixel electrodes 310.

The encapsulation layer 400 may cover and protect the OLED 300. The encapsulation layer 400 may cover the display area DA and may extend beyond the display area DA. The encapsulation layer 400 may include a first inorganic encapsulation layer 410, an organic encapsulation layer 420, and a second inorganic encapsulation layer 430.

The first inorganic encapsulation layer 410 may cover the common electrode 330 and may include silicon oxide, silicon nitride and/or silicon oxynitride. Other layers including a capping layer may also be between the first inorganic encapsulation layer 410 and the common electrode 330. The first inorganic encapsulation layer 410 is formed according to an underlying structure, and a top surface of the first inorganic encapsulation layer 410 is not flat.

The organic encapsulation layer 420 covers the first inorganic encapsulation layer 410, and a top surface of the organic encapsulation layer 420 may be substantially flat. The top surface of the organic encapsulation layer 420 in a portion corresponding to the display area DA may be substantially flat. The organic encapsulation layer 420 may include one or more materials selected from the group consisting of polyethylene terephthalate (PET), polyethylene naphthalate (PEN), polycarbonate (PC), polyimide, polyethylene sulfonate, polyoxymethylene, polyarylate, and hexamethyldisiloxane.

The second inorganic encapsulation layer 430 may cover the organic encapsulation layer 420 and may include silicon oxide, silicon nitride and/or silicon oxynitride. The second inorganic encapsulation layer 430 may be in contact with the first inorganic encapsulation layer 410 at edges outside the display area DA so that the organic encapsulation layer 420 may not be exposed.

When crack occurs in the encapsulation layer 400, no crack may occur between the first inorganic encapsulation layer 410 and the organic encapsulation layer 420 or between the organic encapsulation layer 420 and the second inorganic encapsulation layer 430. Thus, moisture and/or oxygen may be substantially prevented from penetrating into the display area DA.

A touch unit 530 including a touch electrode (not for a touch screen function may be positioned on the encapsulation layer 400. The touch unit 530 may further include a touch protection layer (not shown) for protecting the touch electrode. The touch unit 530 may be positioned directly on the encapsulation layer 400. An insulating layer and a conductive layer for forming the touch unit 530 may be sequentially patterned and formed on the encapsulation layer 400. In an embodiment, the touch unit 530 may be manufactured as a separate panel and may be attached onto the encapsulation layer 400 through an adhesive layer. The touch unit 530 may be positioned on the second inorganic encapsulation layer 430. An inorganic insulating layer may be positioned between the touch unit 530 and the second inorganic encapsulation layer 430.

A protection film 170 is positioned on a bottom surface of the substrate 100. The protection film 170 may be attached onto the bottom surface of the substrate 100 through an adhesive layer 180.

The protection film 170 may include polyethylene-terephthalate (PET). The adhesive layer 180 may include a pressure sensitive adhesive (PSA).

A polarization plate 520 may be attached to the encapsulation layer 400 through an optically clear adhesive (OCA) 510. A printed circuit board (PCB, not shown) or an electronic chip (not shown) may be attached in the second non-display area NDA2.

The polarization plate 520 may reduce external light reflection. For example, when external light passes through the polarization plate 520, is reflected on a top surface of the common electrode 330, and passes through the polarization plate 520 again, the polarization plate 520 may change the phase of the external light as the external light passes through the polarization plate 520 twice. As a result, the phase of a reflected light may be different from the phase of the external light that enters into the polarization plate 520 so that destructive interference may occur. As a result, external light reflection may be reduced so that visibility may be optimized.

An opening may be positioned in the bending area BA of the non-display area NDA. The opening may be formed by removing a part of an inorganic insulating portion IL so that at least a part of the substrate 100 may be exposed. The inorganic insulating portion IL may include a buffer layer 110, a gate insulating layer 120, and an interlayer insulating layer 130. In an embodiment, the inorganic insulating portion IL may include the buffer layer 110 and the gate insulating layer 120.

An organic insulating layer 160a may fill the opening. Because an inorganic layer is weak to stress compared to an organic layer, a part of the inorganic layer (i.e., the inorganic insulating portion IL) disposed in the bending area BA is replaced with the organic insulating layer 160a, so that stress in the bending area BA may be alleviated.

Referring to FIGS. 11 and 12, a first conductive line CL1 and a second conductive line CL2 arranged a separated by a separation area SA. The first conductive line CL1 may be arranged at an outermost edge of the first fan-out portion 21, and the second conductive lines CL2 may be arranged at an outermost edge of the second fan-out portion 22 adjacent to the first fan-out portion 21.

The first conductive line CL1 may include a first upper conductive layer CL1a positioned in the first non-display area NDA1, a first lower conductive layer CL1b positioned in the second non-display area NDA2, and a first connection conductive layer CL1c positioned in the bending area BA.

The second conductive lines CL2 may include a second upper conductive layer CL2a positioned in the first non-display area NDA1, a second lower conductive layer CL2b positioned in the second non-display area NDA2, and a second connection conductive layer CL2c positioned in the bending area BA.

The first upper conductive layer CL1a and the first lower conductive layer CL1b may be positioned on the same layer, and the first connection conductive layer CL1c may be positioned on a different layer from a layer in which the first upper conductive layer CL1a and the first lower conductive layer CL1b are positioned. Referring to FIG. 12, the first upper conductive layer CL1 a and the first lower conductive layer CL1b may be positioned on the gate insulating layer 120, and the first connection conductive layer CL1c may be positioned on the organic insulating layer 160a and the interlayer insulating layer 130.

The first upper conductive layer CL1 a and the first lower conductive layer CL1b may include the same material as a material for forming the gate electrode 213 of the TFT 210, and the first connection conductive layer CD c may include the same material as a material for forming the source electrode 215a and the drain electrode 215b. When a first layer and a second layer include the same material, the first layer and the second layer may be formed in the same patterning process and may be positioned directly on the same surface of an underlying layer An interlayer insulating layer 130 may be between the first upper conductive layer CL1a, the first lower conductive layer CLb and the first connection conductive layer CL1c. The first upper conductive layer CL1a and the first connection conductive layer CL1c, and the first lower conductive layer CLb and the first connection conductive layer CL1c may be electrically connected to each other via contact holes CT penetrating the interlayer insulating layer 130.

The second upper conductive layer CL2a and the second lower conductive layer CL2b of the second conductive line CL2 may be positioned on the same layer, and the second connection conductive layer CL2c may be positioned on a different layer from a layer in which the second upper conductive layer CL2a and the second lower conductive layer CL2b are positioned.

The first upper conductive layer CL1a and the second upper conductive layer CL2a positioned in the first non-display area NDA1 may be positioned on the same layer, and the first lower conductive layer CL1b and the second lower conductive layer CL2b positioned in the second non-display area NDA2 may be positioned on the same layer. In an embodiment, the first and second upper conductive layers CLa and CL2a and the first and second lower conductive layers CL1c and CL2c may be positioned on the same layer.

A power supply portion ELV may be positioned in the separation area SA. The power supply portion ELV shown in FIG. 11 may be a part of a connection line of a first power supply portion 40 or a second power supply portion 50 in one of the above-described embodiments.

Referring to FIG. 13, the power supply portion ELV may include the same material as a material for forming the source electrode 215a and the drain electrode 215b of the TFT 210. The power supply portion ELV may include the same material as a material for forming the source electrode 215a and the drain electrode 215b of the TFT 210 in the first non-display area NDA1 and the second non-display area NDA2 in addition to the bending area BA.

The power supply portion ELV does not overlap the first and second connection conductive layers CL1c and CL2c in the bending area BA. The power supply portion ELV may overlap the first and second upper conductive layers CLa and CL2a and the first and second lower conductive layers CLc and CL2c in the first and second non-display areas NDA1 and NDA2.

Figure 14:
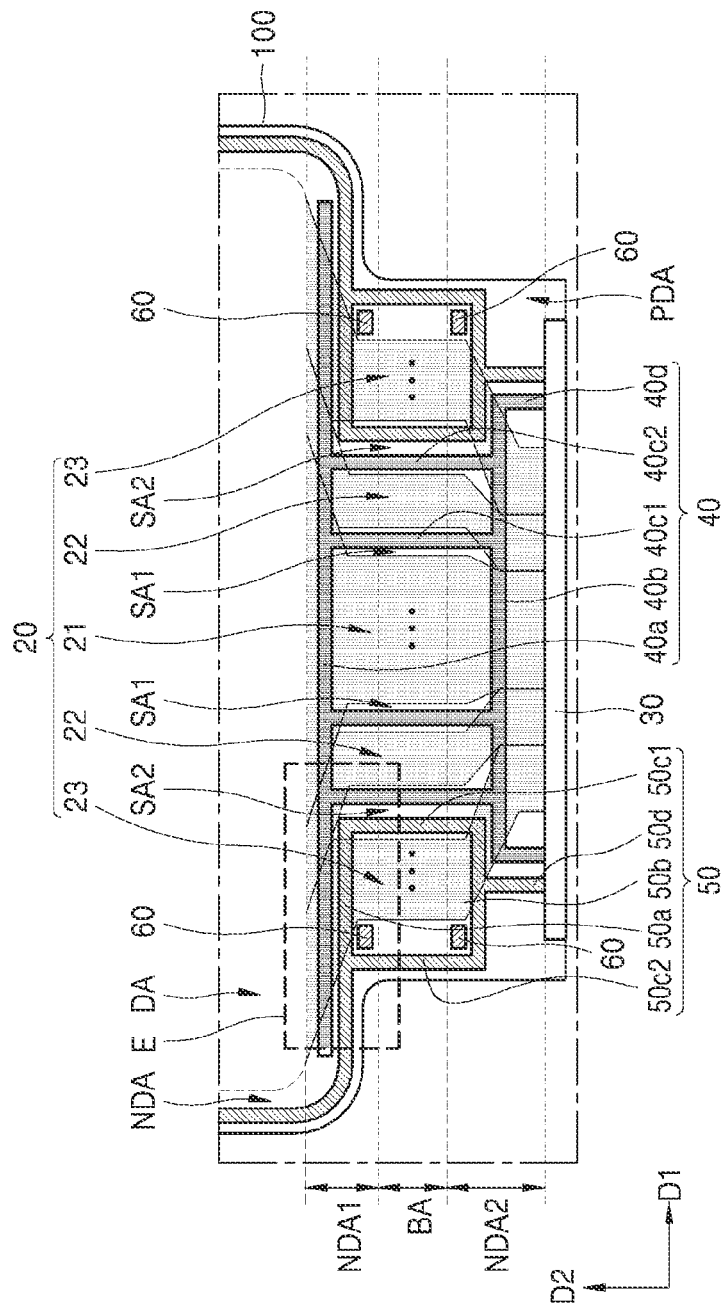
FIG. 14 is a plan view schematically illustrating a part of a display apparatus according to an embodiment.
Figure 15:
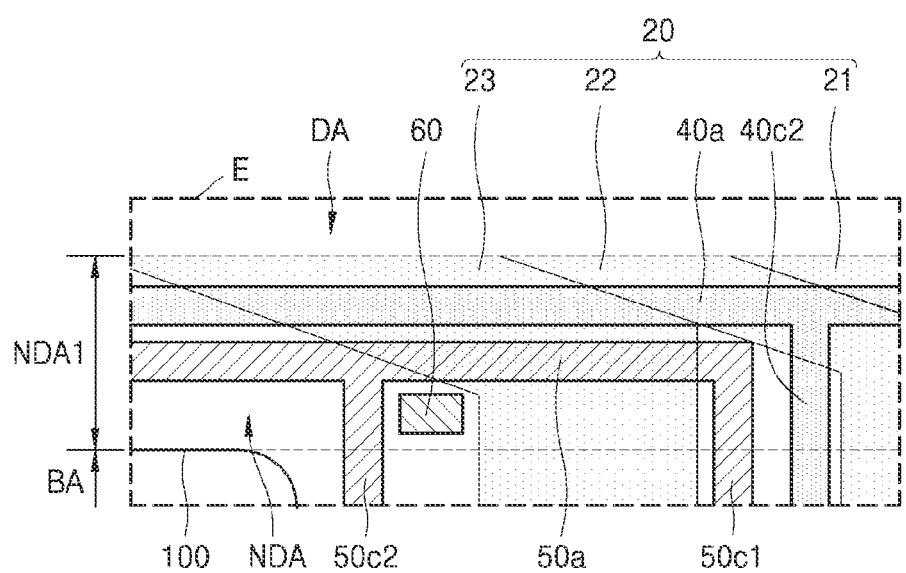
FIG. 15 is a plan view of a region E of FIG. 14 according to an embodiment.

FIG. 14 is a plan view schematically illustrating a part of a display apparatus according to an embodiment, and FIG. 15 is a plan view of a portion E of FIG. 14.

In FIG. 14, the display apparatus may further include a bridge member 60 compared to the above-described embodiments. FIG. 14 is based on FIG. 9. The bridge member 60 may apply to other embodiments.

Referring to FIGS. 12, 14, and 15, the bridge member 60 may connect the touch unit 530 of FIG. 12 to a display panel. Power applied to the display panel may be transmitted to the touch unit 530 through the bridge member 60.

The bridge member 60 may be positioned in the non-display area NDA at an outer edge of the fan-out portion 20. In FIG. 14, a bridge member 60 may be positioned in each of the first non-display area NDA1 and the second non-display area NDA2.

The fan-out structures of the first through third fan-out portions 21, 22, and 23 may reduce the overall width of the fan-out portion 20 in the first direction. Therefore, the width of the first non-display area NDA1 the width in the first direction D1 may be reduced and/or a portion of the first non-display area NDA1 outside the fan-out portion 20 may be maximized. Thus, the bridge member 60 may be easily formed.

It is favorable that the bridge member 60 is sufficiently separated from the fan-out portion 20. Noise occurs due to charging/discharging of the fan-out portion 20, and such a noise may affect signals transmitted to the touch unit 530 by the bridge member 60 if the bridge member is very close to the fan-out portion 20.

In embodiments, the fan-out portion 20 is shielded by the multi-line structures of the first power supply portion 40 and the second power supply portion 50, so that an influence of noise that occurs due to charging/discharging of the fan-out portion 20 may be minimized.

Figure 16:
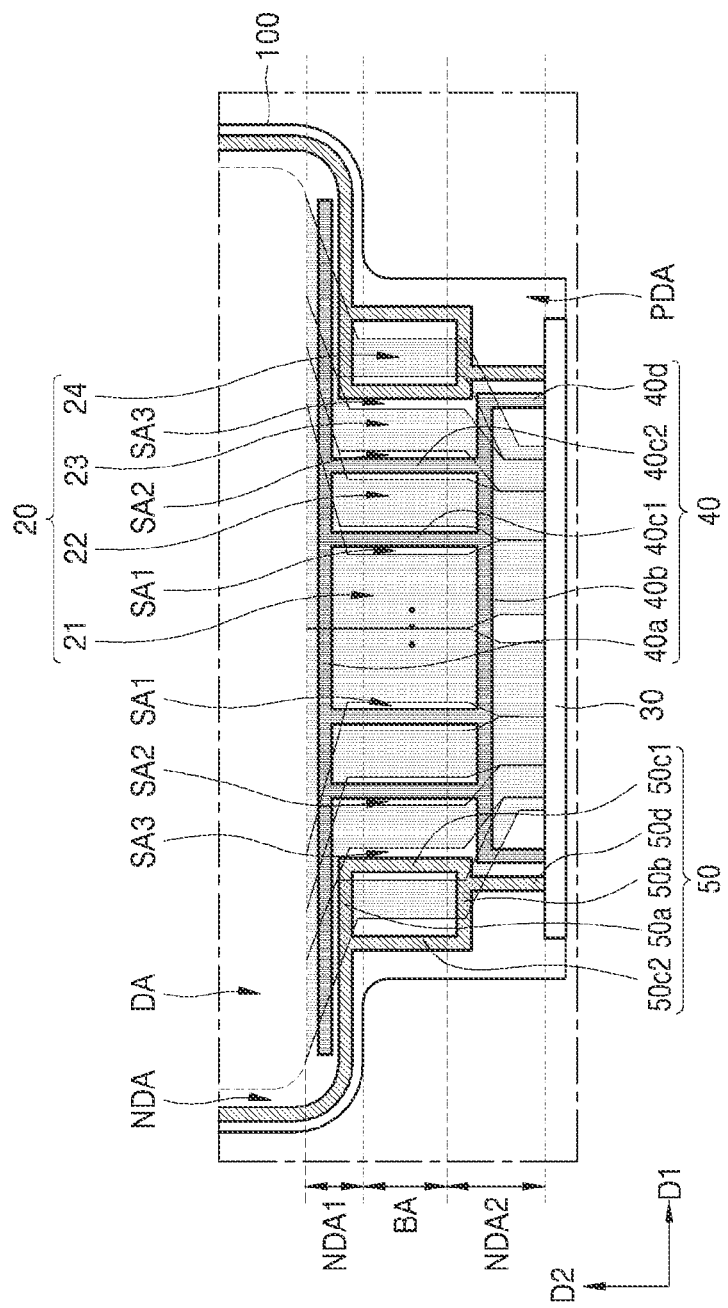
FIG. 16 is a plan view schematically illustrating a part of a display apparatus according to an embodiment.

FIG. 16 is a plan view schematically illustrating a part of a display apparatus according to an embodiment.

Referring to FIG. 16, the fan-out portion 20 may include a first fan-out portion 21, two second fan-out portions 22, two third fan-out portions 23, and two fourth fan-out portions 24, The first fan-out portion 21 may be positioned in the center of the pad area PDA, the second fan-out portions 22 may be positioned at two opposite sides (left and right) of the first fan-out portion 21, the third fan-out portions 23 may be positioned at two opposite sides (left and right) of the two second fan-out portions 22, and the fourth fan-out portions 24 may be positioned at two opposite sides (left and right) of the third fan-out portions 23.

The first fan-out portion 21 and a second fan-out portion 22 may be separated by a first separation area SA1 in the bending area BA. The second fan-out portion 22 and a third fan-out portion 23 may be separated by a second separation area SA2 in the bending area BA. The third fan-out portion 23 and a fourth fan-out portion 24 may be separated by a third separation area SA3 in the bending area BA. The first through third separation areas SA1, SA2, and SA3 may be positioned mostly in the bending area BA, and a portion of the first through third separation areas SA1, SA2, and SA3 may extend into the first non-display area NDA1 and the second non-display area NDA2.

Referring to FIG. 16, the display apparatus may include a first power supply portion 40 and a second power supply portion 50 each having a multi-line structure. The structures of the first power supply portion 40 and the second power supply portion 50 of FIG. 16 are similar to those illustrated in FIG. 9. The structures of the fan-out portion 20 and arrangement of connection lines are different from those of FIG. 9.

In FIG. 16, a first connection line 40c1 of the first power supply portion 40 may be in the first separation area SA1, and a second connection line 40c2 of the first power supply portion 40 may be in the second separation area SA2, and a third connection line 50c1 of the second power supply portion 50 may be in the third separation area SA3, and a fourth connection line 50c2 may be outside the fan-out portion 20. At least a part of the fan-out portion 20 may be positioned between each pair of the first through fourth connection lines 40c1, 40c2, 50c1, and 50c2.

The first fan-out portion 21 may be positioned between two opposite first connection lines 40c1. A second fan-out portion 22 may be positioned between a first connection line 40c1 and a second connection line 40c. A third fan-out portion 23 may be positioned between a second connection line 40c2 and a third connection line 50c1. A fourth fan-out portion 24 may be positioned between a third connection line 50c1 and a fourth connection line 50c2.

Because the first power supply portion 40 and the second power supply portion 50 have the multi-line structures, heat of wires may be effectively distributed and dissipated. Advantageously, luminous uniformity of the display unit 10 may be optimized. The multi-line structures of the power supply portions 40 and 50 and the oblique sections of the fan-out portion 20 may enable minimization of a width of the non-display area NDA.

Figure 18:
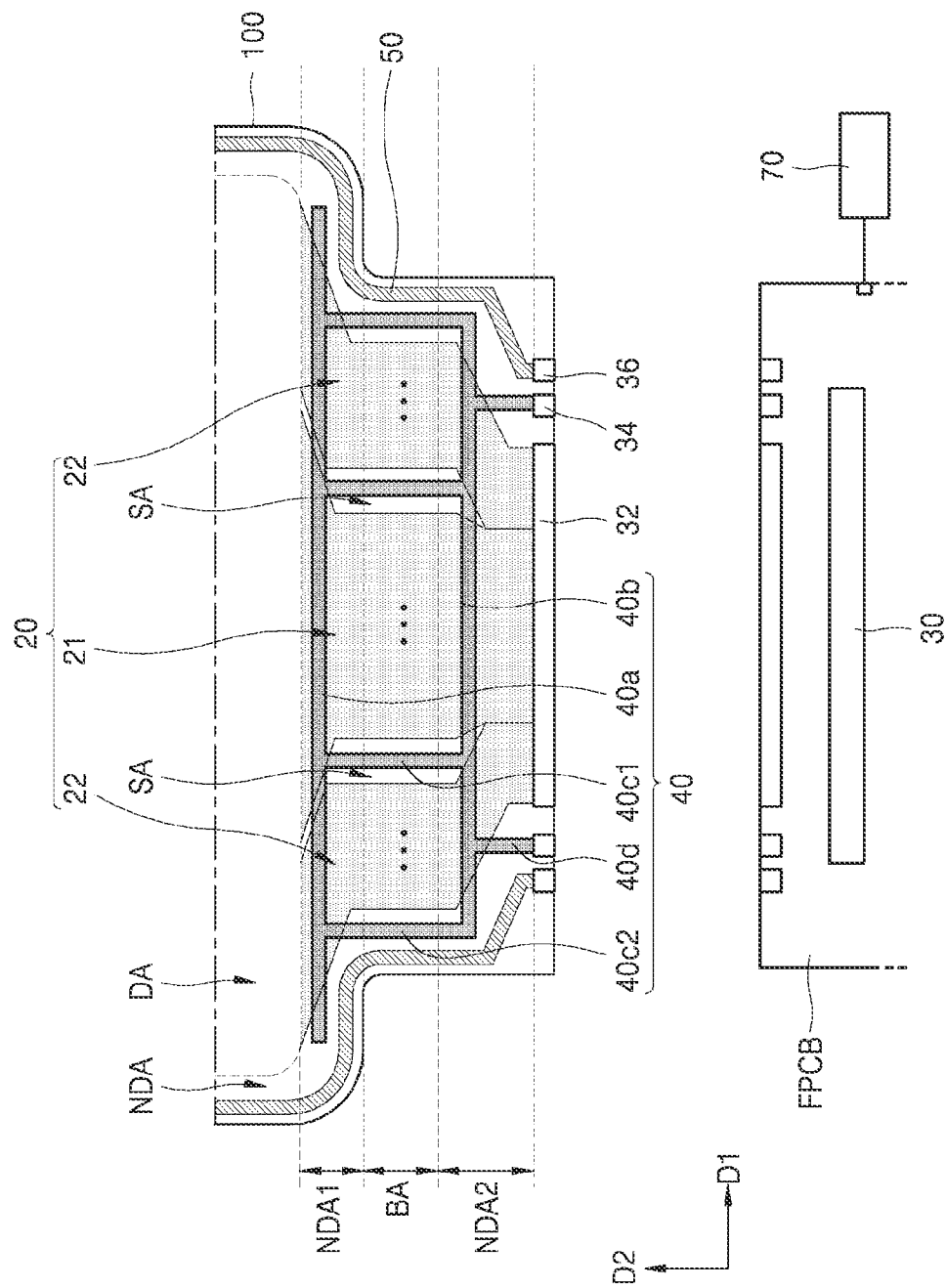
FIG. 18 is a plan view schematically illustrating a part of a display apparatus according to an embodiment.

FIG. 18 is a plan view schematically illustrating a part of a display apparatus according to an embodiment.

In the above-described embodiments, a driving circuit portion 30 is positioned directly on the substrate 100. Referring to FIG. 18, a driving circuit portion 30 is formed on a flexible PCB (FPCB), and the FPCB may be electrically connected to pad portions 32, 34, and 36 of the display panel. The driving circuit portion 30 may be controlled by a controller 70.

According to embodiments, in a display apparatus, a non-display area is reduced, and luminous uniformity is optimized.

Embodiments described herein should be considered in a descriptive sense only and not for purposes of limitation. Descriptions of features or aspects within each embodiment should typically be considered as available in other embodiments.

While embodiments have been described with reference to the figures, various changes may be made without departing from the scope defined by the following claims.

What is claimed is:

1. A display apparatus comprising:
a substrate including a display area, a first non-display area adjacent to the display area, a second non-display area, and a bending area connected between the first non-display area and the second non-display area;
a display unit including a pixel positioned on the display area;
a wire structure comprising a plurality of wirings positioned on the first non-display area, the bending area, and the second non-display area; and
a first power supply structure, the first power supply structure comprising:
a first conductive line extending in a first direction on the first non-display area;
a second conductive line extending in the first direction on the second non-display area; and
a first connection line extending in a second direction intersecting the first direction on the bending area and connecting the first conductive line to the second conductive line,
wherein each of the plurality of wirings includes a first tilted portion extending in a diagonal direction on the first non-display area and a second tilted portion extending in the diagonal direction on the second non-display area,
the first conductive line overlaps the first tilted portion and the second conductive line overlaps the second tilted portions, and
the first connection line is disposed in a separation area between two adjacent wirings among the plurality of wirings, and does not overlap the plurality of wirings of the wire structure.

2. The display apparatus of claim 1,
wherein the first tilted portions of the plurality of wirings in the first non-display area are disposed at equal intervals from each other.

3. The display apparatus of claim 1,
wherein the plurality of wirings of the wire structure comprises a first wirings and a second wirings spaced apart from each other.

4. The display apparatus of claim 3, wherein:
the plurality of wirings of the wire structure are parallel to the first connection line on the bending area,
the first wirings are disposed at equal intervals from each other on the bending area,
the second wirings are disposed at an equal interval from each other on the bending area, and
one of the second wirings that is closest to the first wirings, and one of the first wirings that is closest to the second wirings, corresponds to the two adjacent wirings with the separation area therebetween.

5. The display apparatus of claim 1,
wherein the first power supply structure is electrically connected to an electrode of the display unit.

6. The display apparatus of claim 1, further comprising:
a second power supply structure positioned on the first non-display area, the bending area, and the second non-display area, wherein
the second power supply structure is disposed outside the first power supply structure so as to be closer to an edge of the substrate than the first power supply structure.

7. The display apparatus of claim 6,
wherein the display unit comprises a pixel electrode, a common electrode overlapping the pixel electrode, and an emission layer between the pixel electrode and the common electrode, and wherein the second power supply structure is electrically connected to the common electrode.

8. The display apparatus of claim 6, wherein at least a part of the second power supply structure overlaps the wire structure.

9. The display apparatus of claim 1,
wherein a width of the second conductive line in the first direction is greater than a width in the first direction of the wire structure disposed in the second non-display area.

10. The display apparatus of claim 1,
wherein an end of the first conductive line is located outside the wire structure disposed in the first non-display area.

11. The display apparatus of claim 1,
wherein each of the plurality of wirings of the wire structure includes a first conductive portion disposed on the first non-display area, a second conductive portion disposed on the second non-display area, and a connection portion disposed on the bending area, and
the connecting conductive layer electrically connects the first conductive portion to the second conductive portion.

12. The display apparatus of claim 11, further comprising:
an insulating layer interposed between the connection portion and the first conductive portion and, between the connection portion and the second conductive portion, and
wherein the connection portion and the first conductive portion are connected to each other through a first contact hole penetrating the insulating layer, and the connecting portion and the second conductive portion are connected to each other through a second contact hole penetrating the insulating layer.

13. The display apparatus of claim 11, further comprising:
an inorganic insulating layer extending from the display area and disposed on the non-display area, and
wherein the inorganic insulating layer has an opening exposing an upper surface of the substrate corresponding to the bending area, and
an organic material layer is located in the opening.

14. The display apparatus of claim 13,
wherein at least a portion of the connecting portion is in direct contact with the upper surface of the organic material layer.

15. The display apparatus of claim 11,
wherein the pixel comprises a thin-film transistor and a light-emitting device connected to the thin-film transistor,
the thin-film transistor comprises a semiconductor layer, a gate electrode overlapping the semiconductor layer, and an electrode layer electrically connected to the semiconductor layer, and
the first conductive layer and the second conductive layer comprise a same material as the gate electrode, and wherein the connection layer comprises a same material as the electrode layer.

16. The display apparatus of claim 1, further comprising:
a touch unit positioned above the display unit; and
a bridge structure positioned in at least one of the first non-display area and the second non-display area to supply power to the touch unit.

17. The display apparatus of claim 16,
wherein the bridge structure is spaced apart from the wire structure and located on the outside of the wire structure.

18. The display apparatus of claim 16, further comprising:
a second power supply structure positioned in the first non-display area, the bending area, and the second non-display area, and
the second power supply structure is disposed outside the first power supply structure so as to be closer to the edge of the substrate than the first power supply structure,
wherein the bridge structure is located between the wire structure and the second power supply wiring.

19. The display apparatus of claim 16,
wherein the second power supply structure comprises a third conductive line and a fourth conductive line positioned in the first direction on the first non-display area and the second non-display area, respectively, and a second connection line arranged in a second direction intersecting the first direction and connecting the third conductive line to the fourth conductive line.

20. The display apparatus of claim 19,
wherein in the first non-display area, the first conductive line and the third conductive line are parallel to each other, and the bridge structure is spaced apart from the third conductive line.

* * * * *